(12) United States Patent
Giese et al.

(10) Patent No.: US 6,760,879 B2
(45) Date of Patent: Jul. 6, 2004

(54) SYSTEM AND METHOD OF TURBO DECODING

(75) Inventors: Jochen Uwe Giese, Bad Bentheim (DE); Curt Schurgers, Arendonk (BE); Liesbet Van der Perre, Leuven (BE); Bert Gyselinckx, Leuven (BE); Francky Catthoor, Temse (BE); Marc Engels, Wijgmaal (BE)

(73) Assignee: Interuniversitair Microelektronica Centrum (IMEC), Leuven (BE)

( * ) Notice: Subject to any disclaimer, the term of this patent is extended or adjusted under 35 U.S.C. 154(b) by 0 days.

(21) Appl. No.: 10/354,262

(22) Filed: Jan. 28, 2003

(65) Prior Publication Data

US 2003/0115539 A1 Jun. 19, 2003

Related U.S. Application Data

(62) Division of application No. 09/507,545, filed on Feb. 18, 2000.
(60) Provisional application No. 60/120,738, filed on Feb. 18, 1999, and provisional application No. 60/152,514, filed on Sep. 2, 1999.

(30) Foreign Application Priority Data

Feb. 18, 2000 (EP) .......................................... 002005577

(51) Int. Cl.[7] ........................ H03M 13/00; H03M 13/03
(52) U.S. Cl. ...................................... 714/755; 714/786
(58) Field of Search ............................... 714/755, 786, 714/791, 793, 794, 795; 375/340, 262, 265, 341

(56) References Cited

U.S. PATENT DOCUMENTS

| | | | | |
|---|---|---|---|---|
| 5,721,745 A | * | 2/1998 | Hladik et al. | ................ 714/755 |
| 5,933,462 A | | 8/1999 | Viterbi et al. | ................ 375/341 |
| 6,023,783 A | | 2/2000 | Divsalar et al. | ............ 714/792 |
| 6,252,917 B1 | * | 6/2001 | Freeman | ..................... 375/340 |
| 6,304,995 B1 | * | 10/2001 | Smith et al. | ................ 714/786 |
| 6,484,283 B2 | * | 11/2002 | Stephen et al. | ............. 714/786 |

FOREIGN PATENT DOCUMENTS

| EP | 0 827 284 A1 | 3/1998 |
|---|---|---|
| WO | WO 96/13105 | 5/1996 |

OTHER PUBLICATIONS

Halter S, et al. "Reconfigurable Signal Processor for Channel Cording & Decoding in Low SNR Wireless Communications." IEEE Workshop in signal Processing Systems, SIPS, Design and Implementation, Oct. 8, 1998, pp. 260–264.

Hsu J–M, et al. "A Parallel Decoding Scheme for Turbo Codes." ISCAS 1998. Proceedings of the 1998 IEEE International Symposium on Circuits and Systems, Monterey, CA, May 31–Jun. 3, 1998, New York, NY: IEEE, US, vol. 1, May 31, 1998, pp. 445–448.

(List continued on next page.)

*Primary Examiner*—Albert Decady
*Assistant Examiner*—Shelly A Chase
(74) *Attorney, Agent, or Firm*—Knobbe, Martens Olson & Bear LLP

(57) ABSTRACT

Methods and architectures for turbo decoding are presented. The methods are such that low energy consumption is obtained with reduced memory requirements. Moreover the methods show improved performance with respect to latency.

12 Claims, 14 Drawing Sheets

OTHER PUBLICATIONS

Schurgers, et al. "Energy Efficient Data Transfer and Storage Organization for a MAP Turbo Decoder Module." Proceedings 1999 International Symposium on Low Power Electronics and Design. San Diego, CA, Aug. 16–17, 1999, International Symposium on Low Power Electronics and Design, New York, NY: ACM, US, Aug. 16, 1999, pp. 76–81.

Viterbi A. J., "An Intuitive Justification and a Simplified Implementation of the Map Decoder for Convolutional Codes," IEEE Journal on Selected Areas in Communications, IEEE Inc., New York, US vol. 16, No. 2, Feb. 1, 1998, pp. 260–264.

European Search Report. Application No. EP 00 20 0557. Date of Completion, May 28, 2002.

Joeressen, et al., "High–Speed VLSI Architectures for Soft–Output Viterbi Decoding", vol. 8, No. 2, 1994 pps. 169–181.

Garrett, et al., "Low Power Architecture of the Soft–Output Viterbi Algorithm", ISLPED 1998, pps. 262–267.

Berrou, et al., Near Shannon Limit Error–Correcting Coding and Decoding: Turbo–Codes (1), IEEE, 1993, pps. 1064–1070.

S. Pietrobon, "Efficient Implementation of Continuous MAP Decoders and a Synchronisation Technique for Turbo Decoders", Int. Symp. on Inform Theory and its Applications, Sep. 1996, pps. 586–589.

Raouafi, et al. "Saving Memory in Turbo–Decoders Using the Max–Log–MAP Algorithm", IEE Colloquium. Turbo Codes in Digital Broadcasting—Could it Double Capacity?, London, UK Nov. 22, 1999, pp. 14/1–4.

Giuletti, et al., "A Study on Fast, Low–Power VLSI Architectures for Turbo Codes", IMEC, Belgium, 2000.

Shannon, C.E., "A Mathematical Theory of Communication", Reprinted with corrections from *The Bell System Technical Journal*, vol. 27, pp. 379–423, 623–656, Jul., Oct., 1948.

Masera, et al., "VLSI Architecture for Turbo Codes", IEEE Transactions on Very Large Scale Integration (VLSI) Systems, vol. 7, No. 3, Sep. 1999.

Bekooij, et al., "Power–Efficient Application–Specific VLIW Processor for Turbo Decoding", ISSCC 2001, Session 12, Signal Processing for Storage and Coding, 12.1.

Hong, et al., Design and Implementation of a Low Complexity VLSI Turbo–Code Decoder Architecture for Low Energy Mobile Wireless Communications, Journal of VLSI Signal Processing Systems 24, 43–57 (2000).

$3^{rd}$ Generation Partnership Project; Technical Specification Group Radio Access Network; Multiplexing and channel coding (FDD) (Release 1999).

* cited by examiner (a) Δ=2L  (b) Δ=L  (c) Δ=0

▨ Size input cache
▨ Size state metric memory

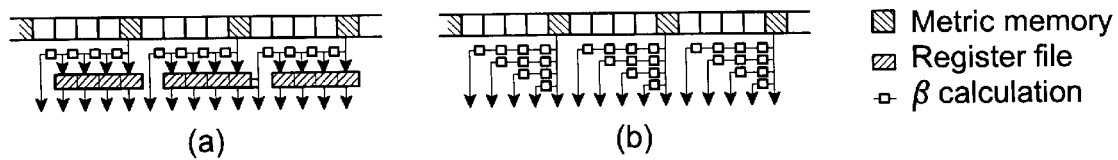
FIG. 3
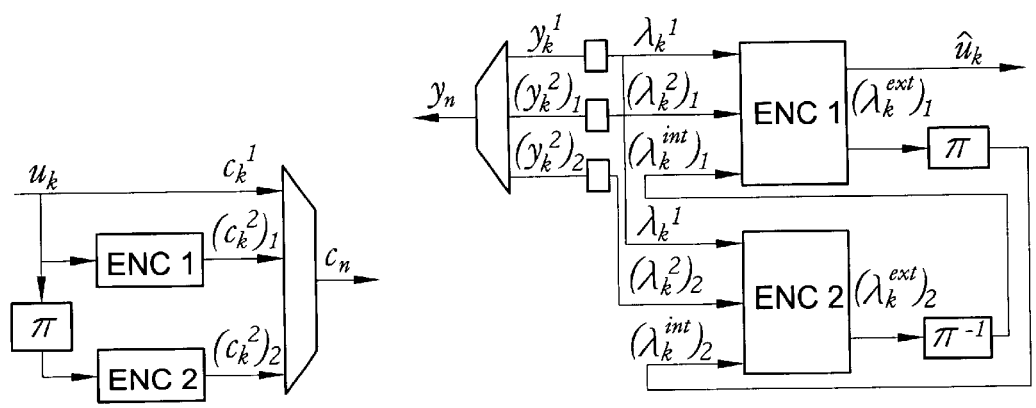
FIG. 4A
(PRIOR ART)
FIG. 4B
(PRIOR ART)

Latency: $2NT$

The standard algorithm $(L + 2S)T$

The parallelized algorithm (3 windows)

Metric reuse

Memory and metric reuse

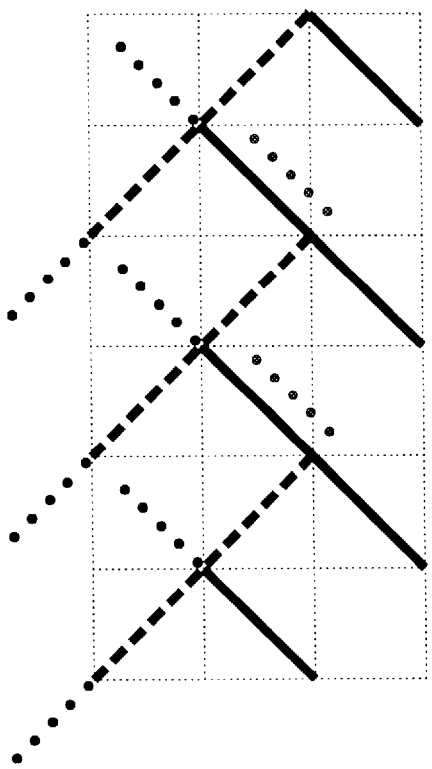
FIG. 12
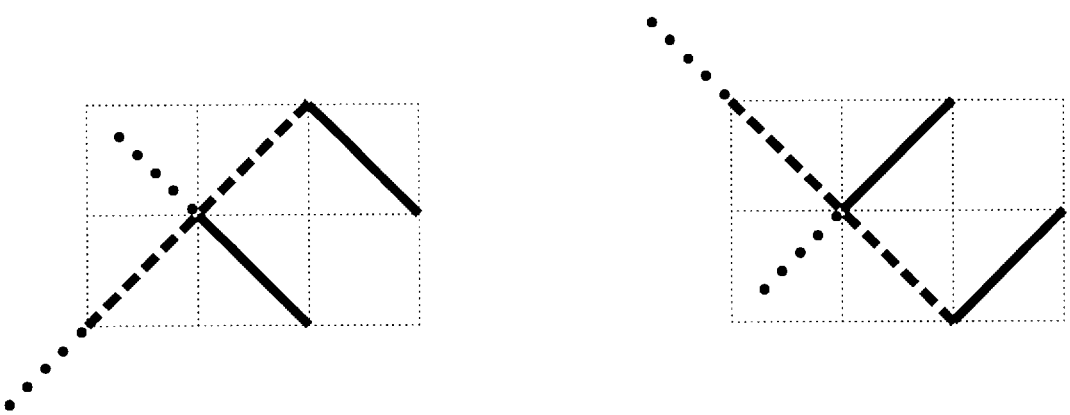
$K = 3, \mu = \frac{1}{2}, \delta = 1$, type A    $K = 3, \mu = \frac{1}{2}, \delta = 1$, type B
FIG. 13A                                          FIG. 13B

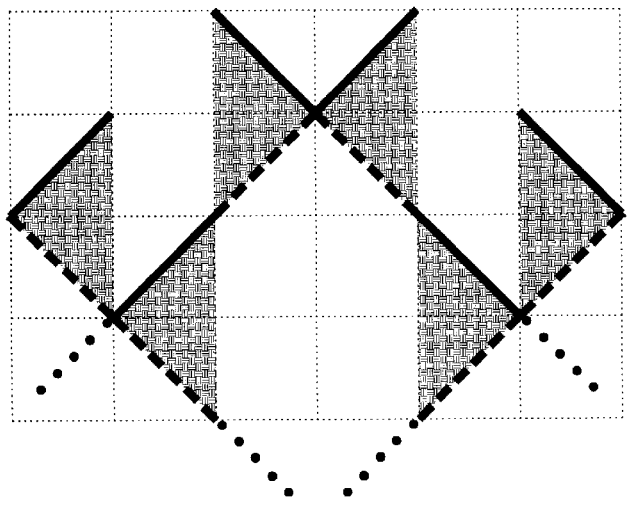
FIG. 14C  $\mu = \frac{1}{3}, \delta = \frac{2}{3}$
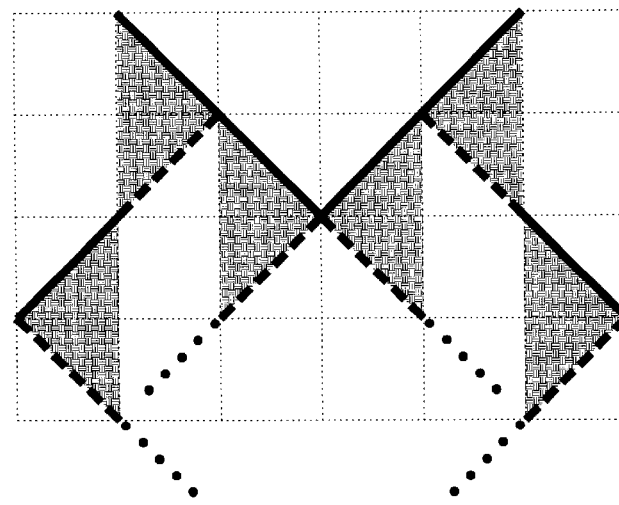
FIG. 14B  $\mu = \frac{1}{3}, \delta = \frac{2}{3}$
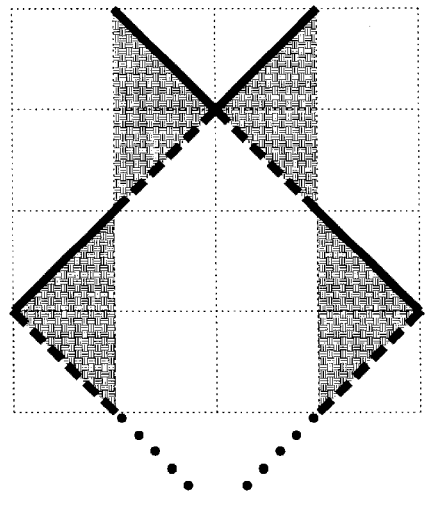
FIG. 14A  $\mu = \frac{1}{2}, \delta = \frac{1}{2}$

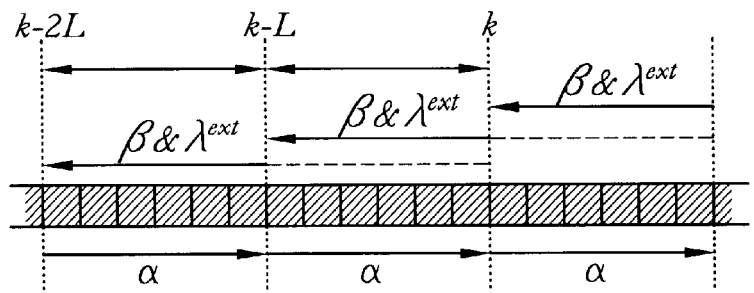
FIG. 19
*(PRIOR ART)*
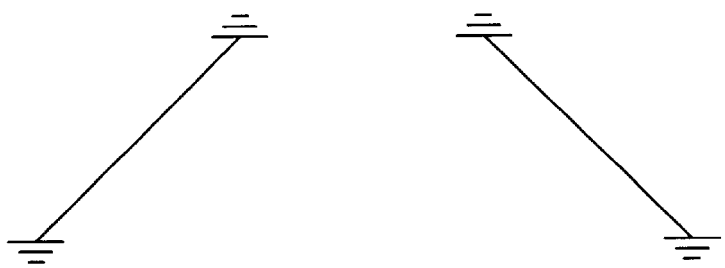
FIG. 20A     FIG. 20B
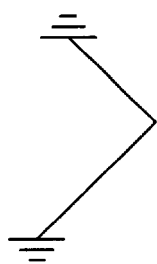     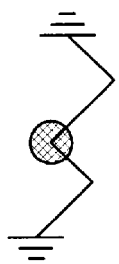     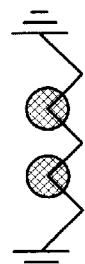
FIG. 20C     FIG. 20D     FIG. 20E

Graphical representation of two possible algorithms

SYSTEM AND METHOD OF TURBO DECODING

RELATED APPLICATIONS

This patent application claims the benefit of and incorporates by reference in its entirety U.S. application Ser. No. 09/507,545, filed Feb. 18, 2000, which in turn claims the benefit of U.S. Provisional Application No. 60/120,738, filed Feb. 18, 1999, and U.S. Provisional Application No. 60/152,514, filed Sep. 2, 1999, each of which are also incorporated by reference in their entirety.

BACKGROUND OF THE INVENTION

1. Field of the Invention

The invention relates to turbo decoding methods and systems being adapted for execution of these turbo decoding methods.

2. Description of the Related Technology

Turbo encoding is characterized in that the to be encoded signal $u_k$ is encoded by a first encoder ENC1, resulting in a first encoded signal and an interleaved version of $u_k$ is encoded by a second encoder ENC2, resulting in a second encoded signal. The original to be encoded signal $u_k$, the first and second encoded signal are then transmitted. In the transmitted signal one can thus distinguish a sequence of blocks, being said to be encoded signal $u_k$, said first and second encoded signal. FIG. 4(a) shows such an encoder set-up. One can state that the complete encoder transforms the original input bits $u_k$ in output symbols $c_k$, comprising of a concatenation of convolutional component codes, being separated by a pseudo random interleaver. It is important to note that in turbo coding reinitialisation of the state of the encoder is essential for the corresponding decoding procedure. Often also part of the input sequence to such an encoder is adapted such that the end state of the encoder is forced to be a particular known state. Because of the fact that the original signal is transmitted uncoded also, one denotes such a coding technique also as a systematic code. Note that a pseudo random interleaver has a mapping function having a substantially irregular pattern.

Turbo decoding is characterized in that the received transmitted code is decoded by a first decoder, resulting in a first decoded signal. Turbo decoding does not stop however after determining said first decoded signal. Instead a second decoder does another decoding step, resulting in a second decoded signal, exploiting the received transmitted code and an interleaved version of the first decoded signal. Afterwards said first decoder performs a further decoding step, exploiting said received transmitted code and an interleaved version of said second decoded signal. This procedure is iteratively and then the final decoded signal is determined. Said first and second decoded signal can be denoted intermediate data elements, as these are not the final decoded signal. Turbo decoding can be described as performing iteratively decoding methods, embedded in the decoders. The decoding method of a first decoder exploits in an iteration data generated by another decoder in the previous iteration. FIG. 4(b) shows such a turbo decoding set-up. Said intermediate data elements are denoded also extrinsic information or a posteriori information. The data element determined in a previous iteration is used as intrinsic information in a next iteration. It is expected that performing said iteration results in intermediate data elements being approximations of a maximum likelihood estimate of the original signal $u_k$. Because said first and second decoder exploit signals from each other, only one of said decoders is active at a time, meaning that half of the hardware required in a turbo decoding architecture is idle while performing turbo decoding. Known approaches for solving this is using pipelining, meaning that a sequence of hardware blocks is used for turbo decoding. A first block performs first decoding, a second block performs second decoding, a third block performs again said first decoding and so on. While said third block performs its first decoding step said first block can already start executing its first decoding step on a new sequence. Naturally such an approach requires a lot of hardware.

Reference to turbo decoding and decoding methods used therein are found in: [D. Garrett, M. Stan, "Low Power Architecture of the Soft-Output Viterbi Algorithm", Proceedings International Symposium on Low Power Electronics and Design (ISLPED'98), Monterey, Calif., Aug. 10–12, 1998, pp. 262–267][O. J. Joeressen, M. Vaupel, H. Meyr, "High-Speed VLSI Architectures for Soft-Output Viterbi Decoding", Journal of VLSI Signal Processing, 1–12, 1998]. [C. Berrou, A. Glavieux, P. Thitimajshima, "Near Shannon limit error-correcting coding and decoding: Turbo-codes," Proc. ICC'93, Geneva, Switzerland, May 1993, pp. 1064–1070]. [S. S. Pietrobon, "Efficient Implementation of Continuous MAP Decoders and a Synchronisation Technique for Turbo Decoders", Int. Symp. on Inform. Theory and its Applications, Victoria, BC, Canada, Sep. 1996, pp. 586–589].

The decoding methods used by the decoders within said turbo decoding set-up are now described shortly. In particular Maximum A Posteriori approaches are discussed. The log-SISO algorithm is chosen as specific algorithm for the description although the invention is not limited hereto. E.g. also Soft-output Viterbi Algorithms can be used. By operating in the logarithmic domain expensive multiplications are avoided. Instead the E-operation is introduced, which can easily be implemented using table look up or approximated by taking the maximum. The extrinsic information $\lambda_k^{ext}$ is calculated based on α and β state metrics as indicated in formula 1 in which $c^1$ and $C^2$ are the output bits for an encoder state transition from s to s' (FIG. 17).

$$\lambda_k^{ext} = \underset{x^i=1, s \to s'}{E} [\delta_k(s,s')] - \underset{x^i=0, s \to s'}{E} [\delta_k(s,s')]$$

with $\delta_k(s,s') = \alpha_k(s) + \beta_k(s') + c^1 \cdot \lambda_k^1 + c^2 \cdot \lambda_k^2$ The log likelihood ratios $\lambda_k^i$ (for i=1 . . . 2) of the channel symbols $y_k^i$ are defined as:

$$\lambda_k^i = \log\left[\frac{P(c_k^i = 1 \mid y_k^i)}{P(c_k^i = 0 \mid y_k^i)}\right]$$

After some iterations the decoded bits $\hat{u}_k$ are calculated as ($\lambda_k^{int}$ is the intrinsic information):

$$\hat{u}_k = \text{sign } [\lambda_k^{int} + \lambda_k^{ext} + \lambda_k^1]$$

The α and β metrics are obtained through formula 3 and 4 based on a forward recursion and a backward recursion respectively. They both start in a known initial state at the beginning (for α) or end (for β) of the block.

$$\alpha_{k+1}(s') = \underset{s \to s'}{E} [\alpha_k(s) + c^1 \cdot \lambda_k^{int} + c^1 \cdot \lambda_k^1 + c^2 \cdot \lambda_k^2]$$

-continued $$\beta_{k-1}(s) = \underset{s \to s'}{E} [\beta_k(s') + c^1 \cdot \lambda_k^{int} + c^1 \cdot \lambda_k^1 + c^2 \cdot \lambda_k^2]$$

In general in these MAP algorithms a computing step and a determining step can be distinguished. Said compute step is characterized by the computation of two vector sequences or state metrics. Said vector sequences are computed via recursions. A forward recursion for determining said first state metrics and a backward recursion for determining said second state metrics are distinguished. Said state metric determination exploits the encoded signal (via $\lambda_k^1$, $\lambda_k^2$) and intermediate data elements $\lambda^{INT}$, produced by another decoder. Said decoded signal $u_k$ is being determined by combining said encoded signal (via $\lambda_k^1$), said first state metrics and said second state metrics (via $\lambda^{EXT}$). Note that the coding process can be seen as a transition in a finite state machine, wherein the register content of the convolution coder, denotes the state of the encoder, which completely determines the behaviour of the coder for the next input bit. One often represents this with a trellis graph, showing state transitions. The state metrics exploited in the decoding process refer in principle back to these encoder state.

The α metrics need to be stored however since the first $\lambda^{ext}$ can only be calculated once the entire forward recursion is finished. This results is a storage of N metrics for all the states, which is unacceptable for most practical interleaver sizes N. A solution to the storage requirement problem of the normal SISO algorithm presented above, is the introduction of sliding windows [S. S. Pietrobon, "Efficient Implementation of Continuous MAP Decoders and a Synchronisation Technique for Turbo Decoders", Int. Symp. on Inform. Theory and its Applications, Victoria, BC, Canada, Sep. 1996, pp. 586–589]. The β state metrics are not initialized at the end of the block, but at some point k (see FIG. 19). After the backward recursion over window size L time steps the metrics provide an accurate approximation at time k–L. The next metrics $\lambda_{k-L}$ through $\lambda_{k-2L}$ are calculated and used to produce the extrinsic values. The window is then shifted by a value L. This algorithm requires the storage of only L α metrics.

The use of overlapping windows, also denoted sliding windows, comprises the computation of one of said state metrics, with its corresponding recursion being validly initialized, while the other state metric is then determined a plurality of times but each time only part of said state metrics are determined and the recursions used therefore are not validly initialized. Recursions wherein only part of said state metrics and which are not validly initialized are further denoted restricted recursions. The overlapping window approach can then be described as a method wherein one of said state metrics is determined completely with a validly initialized recursion while the other state metric is then determined a plurality of times with restricted recursion, determining only part of these state metrics. It should be emphasized that although so-called invalid initializations are used, the turbo decoding schemes show the property that after some recursion steps, said computed state metrics converge towards the state metrics expected when valid initializations were exploited. In so-called overlapping window approaches described above either one of said state metrics is determined completely and with a valid initialized recursions.

The sliding windows approach cures the memory requirement problems only partially. An important problem with turbo decoding, either in a standard way or via overlapping windows, is the long latency, due to the intrinsic iterations in combination with the long recursions.

SUMMARY OF CERTAIN INVENTIVE ASPECTS

In the invention aspects related to the overall turbo decoding approach and aspects related to the particular decoding approach used within such a turbo decoding approach can be distinguished. It should be emphasized that, although the decoding approaches aspects of the invention are situated within the overall turbo decoding approach in the description, the contribution of each of these aspects should be recognized in general.

Turbo decoding schemes can be characterized as methods for determining a decoded signal from an encoded signal, being encoded by a turbo encoding scheme. In such a turbo decoding scheme, besides a step of inputting or entering said encoded signal, a compute step and a determining step can be distinguished. Said determining step can be simultaneous, partly overlapping or after said with said compute step. In turbo decoding schemes said compute step is characterized by the computation of two vector sequences. One vector of such a sequence is denoted a state metric. Therefore in said compute step state metrics are determined. With first state metrics is meant a first vector sequence. With second state metrics is meant a second vector sequence. Said vector sequences are computed via recursions. With recursion is meant that the following vector in such a vector sequence is determined by at least the previous vector in said sequence. In turbo decoding schemes a forward recursion for determining said first state metrics and a backward recursion for determining said second state metrics are distinguished. The terms forward and backward refer to the order in which said encoded signal is inputted. Turbo decoding schemes are characterized by the fact that said decoded signal is being determined by combining said encoded signal, said first state metrics and said second state metrics.

In a first aspect of the invention particular ways of storing said vector sequences or state metrics in memories are presented. Indeed when one wants to determine said decoded signal from said encoded signal and said state metrics, and when said state metrics are not produced or computed at the same time as these state metrics are needed for consumption, storage of already computed state metrics is a possible way to go. As said vector sequences, exploited in turbo decoding schemes, are typically long, large memories, being power consumptive and long access times, are then needed. As low power implementation and low latency of turbo decoding schemes is aimed at in the invention, an alternative approach is presented. After inputting said encoded signal, said first state metrics is determined by a forward recursion. Said forward recursion is properly initialized. Said forward recursion exploits said inputted encoded signal. However not all said computed first state metrics or vectors are stored in a memory. Note that all said first state metrics should be computed one after another due to the forward recursion approach. In the invented approach however only part of said necessarily computed first state metrics is stored in a memory, denoted a first memory. With storing part of said computed first state metrics is meant that the amount of stored values is less than the total size or length of said vector sequence or first state metrics. In practice it is meant that an amount of stored values being substantially less than the total length is stored. After computing said first state metrics and stored part of them, said second state metrics is computed with a backward recursion. When a particular state metrics of said backward determined state metrics becomes available, it can be almost directly exploited for determining said decoded signal from said encoded signal, said second state metrics and said computed first state metrics. Said second state metrics thus does not need a large buffer memory as its consumption is scheduled near in time to its production. Said invented approach can be characterized in that only a part of said computed first state metrics is stored in a first memory, more in particular, in a memory being substantially smaller than the size or length of said first state metric sequence.

In an embodiment of this first aspect of the invention said decoded signal is determined by exploiting a calculation step, wherein said decoded signal is determined directly form said encoded signal, said second state metric and said computed first state metrics, being stored in said first memory.

In another embodiment of this first aspect of the invention said decoding signal is determined from said encoded signal, said second state metrics and the needed first state metrics, itself being determined or recomputed. With said recompilation is not meant that said first state metrics is determined all over again, starting from the initialization. With recomputation is meant that first state metrics, being computed before but not stored, are recomputed from first state metrics, being computed and stored. More in particular first state metrics, not stored and lying in between or intermediate stored first state metrics are determined from the first state metrics, bounding the sequence of not-stored ones. One can then state that in said decoded signal determining step explicitly, recomputed first state metrics are used.

In a further embodiment of this first aspect of the invention wherein said non-stored first state metrics are recomputed one does not necessarily consume said recomputed values directly when producing or recomputing them. Further it is not necessarily that said non-stored first state metrics are recomputed several times when needed. Indeed such unnecessary recomputation or direct production-consumption restriction can be circumvented by at least partly storing said recomputed values in a second memory. In practice said recomputed values will be stored only temporary in said second memory. The size of said second memory will be substantially less than the size of said first state metric sequence. In an embodiment of the invention said second memory size will be equal or even less than the amount of non-stored first state metrics in between said stored ones. Said second memory can thus contain at most said intermediate first state metrics. The size constraint on said second memory, results in overwriting said stored recomputed values.

Alternatively one can state that in the invention instead of storing the $\beta$ metrics, being determined with a backward recursion, for all time steps k, only some are stored and the missing ones are recalculated when they are needed to compute $\lambda^{out}$. When we store only $1/\theta$ of the backward state metrics, this means that only $\{\beta_i(S_0), \beta_i(S_1), \ldots, \beta_i(S_n)\}$, $\{\beta_{i+\theta}(S_0), \beta_{i+\theta}(S_1), \ldots, \beta_{i+\theta}(S_n)\}$, $\{\beta_{i+2\theta}(S_0), \beta_{i+2\theta}(S_1), \ldots, \beta_{i+2\theta}(S_n)\}$, . . . are stored in memory. The parameter $\theta$ is determined by simulations, taking into account the architecture on which the algorithm should be implemented, the appropriate power and area models and the cost criterion, being area, energy consumption and latency. Note that alternatively the same approach can be used for the state metric being determined with a forward recursion.

In a second aspect of the invention, particular ways of executing said state metric recursions and said decoded signal determination step are presented aimed at providing methods wherein a trade-off between latency and memory occupation can be made. In a traditional execution of a turbo decoding scheme one computes via a forward recursion said first state metrics, being validly or correctly initialized, and then one computes said second state metrics, being validly initialized, with a backward recursion. Simultaneously or after said second state metric computation, one determines said decoded signal. Executing turbo decoding schemes in such a way results in a long latency and huge memories for storage of said state metrics and said inputted encoded signal. Another approach, denoted also as the use of overlapping windows, comprises the computation of one of said state metrics, with its corresponding recursion being validly initialized, while the other state metric is then determined a plurality of times but each time only part of said state metrics is determined and the recursions used therefore are not validly initialized. Recursions wherein only part of said state metrics is determined and which are not validly initialized are further denoted restricted recursions. The overlapping window approach can then be described as a method wherein one of said state metrics is determined completely with a validly initialized recursion while the other state metric is then determined a plurality of times with restricted recursion, determining only part of these state metrics. It should be emphasized that although so-called invalid initializations are used, the turbo decoding schemes show the property that after some recursion steps, said computed state metrics converge towards the state metrics expected when valid initializations were exploited. In so-called overlapping window approaches described above, either one of said state metrics is determined completely and with a valid initialized recursions. Such approaches still show a long latency. In the invention a method for turbo decoding is presented wherein for both state metrics (first and second) only part of these state metrics is determined with a validly initialized recursion, while the other parts, thus the one not determined by a validly initialized recursion, are being determined by restricted recursions. More in particular a plurality of said restricted recursions are needed. Execution of part of said restricted recursions are performed at the same time. The invented approach is further denoted a double flow approach.

In an embodiment of this second aspect of the invention, the decoded signal determining step is performed while executing said validly initialized recursions. An example is given now, but it should be clear that the role of said first and said second state metric can be reversed. In such approach, one starts a first restricted recursion for determining with a backward recursion part of said second state metric. After some recursion steps, valid values of said second state metric are obtained. When the second state metric to be determined by said restricted recursion are all determined, one starts computing said first state metric, with said validly initialized forward recursion and one consumes substantially simultaneously the computed first state metric, the already determined second state metric, if valid, and the encoded signal, in order to determine the decoded signal. After a while no valid second state metrics from said first restricted recursion are available. Therefore a second restricted recursion, being started already, is now providing said second valid state metrics. The first state metric is still provided by said validly initialized first state metric. The same approach is used for said second state metric. A validly initialized backward recursion is started, supported with restricted recursion of said first state metrics. It should be emphasized that said validly initialized recursions, with their supporting restricted recursions, are essentially dealing with other parts of said state metrics. Said validly initialized recursions stop when they reach same point in the vector sequence of state metrics, indicating that the full range of state metrics is covered.

In another embodiment of the invention of the second aspect of the invention said decoding signal determining step is performed while executing said non-validly initialized recursions. An example is given now, but it should be clear that the role of said first and said second state metric can be reversed. In such approach one starts a first restricted recursion for determining with a backward recursion part of said second state metric. Simultaneously one starts computing said first state metric, with said validly initialized forward recursion but the computed first state metric values are not directly consumed for determining said decoded signal. After some recursion steps valid values of said second state metric are obtained. Then one further determines with said restricted recursion second state metrics and one consumes substantially simultaneously the already computed first state metric, the further determined second state metric and the encoded signal, in order to determine the decoded signal. The first state metrics are also further determined with said forward recursion. After a while the part of the decoded signal that can be determined from said second and first state metrics is found. Therefore a second restricted recursion, being started already, is now providing said second valid state metrics, while the first state metrics were already determined by said continuing forward recursion. The same approach is used for said second state metric. A validly backward recursion is started, supported with restricted recursion of said first state metrics. It should be emphasized that said validly initialized recursions, with their supporting restricted recursions, are essentially dealing with other parts of said state metrics. Said validly initialized recursions stop in this case not when they reach the same point in the vector sequence but soon thereafter. Indeed some part of the decoded signal still has to be determined. In this last phase the validly initialized recursion deliver the state metrics to be consumed for decoded signal determination.

In another embodiment of the invention of the second aspect of the invention said decoded signal determining step is being performed partly while executing part of said non-validly initialized recursion and partly while executing said validly initialized recursion. This embodiment can be seen as a mixed form of the two embodiment described above. Again two validly initialized recursions, one for each state metric, are executed. Each of said validly initialized recursions, is being supported by so-called restricted recursions of the complementary state metric. Determining a value of the decoded signal is possible when both corresponding state metrics are available and of course valid. In this embodiment the first restricted recursions are started a substantial time before said validly initialized recursions begun.

In a third aspect of the invention particular methods for turbo decoding, comprising essentially of turbo decoding method steps of smaller sizes are presented. A turbo decoding method determines in principle a decoded signal by combining an encoded signal, first state metrics and second state metrics. Said metrics are computed via a forward or a backward recursion. Said recursions in principle need to be validly initialized. However because even invalidly initialized recursions converge after some dummy state metric computations towards valid values of state metrics, one can work with invalidly initialized recursions also, as pointed out in the embodiments discussed above. When for both recursions invalid initializations are used, one can split up the turbo decoding algorithm in a plurality of turbo decoding method steps of smaller sizes, meaning that the vector sequences or state metrics in such methods are of smaller length. In principle said state metrics of such method of smaller size together define the full state metrics, except that also some dummy metrics are computed. It can be stated that the turbo decoding method comprises of executing a plurality of compute and determining steps. Each of said compute and determining steps comprising of computing part of said first state metrics with a forward recursion and part of said second state metrics with a backward recursion, and determining part of said decoded signal by combining part of said encoded signal, part of said first state metric and part of said second state metric. Although said compute and determining steps can be seen as totally separate methods, in the invention particular scheduling of these compute and determining steps are proposed such methods support each other, by providing valid initializations to each other.

In an embodiment of this third aspect of the invention at least two of these compute and determining steps are executed or scheduled such that these are performed partially overlapping in time.

In another embodiment of this third aspect of the invention at least two of said compute and determining steps are being scheduled such that initialization of one of said recursions for said computing state metrics of one of said compute and determining steps is being based on a computed value of said recursion of said state metrics in the other compute and determining step.

In the fourth aspect of the invention a method for iterative decoding is presented. Note that iterative decoding is typically used in turbo decoding. In principle the presented iterative decoding method can be exploited in a context different of turbo decoding also. Turbo decoding is characterized by performing a first decoding step followed by a second decoding step, and iteratively performing these two decoding steps. After loading or inputting the encoded signal, a first decoding step is performed, which produces or determines a first intermediate data element. The second decoding step exploits an interleaved version of said first intermediate data element in order to produce or determine a second intermediate data element. With interleaved version is meant that essential the same values are stored in said data element but the ordering within said data element, being a vector, is changed. After this both said first and said second decoding step are performed iteratively but never simultaneously until from one of said data elements said encoded signal can be deduced. Note that this procedure implies that the hardware performing said first decoding step and the hardware performing said second decoding step are not active simultaneously, thus an inefficient use of the overall hardware is obtained. Note that a standard turbo decoding set-up, as depicted in FIG. 4(b), requires two memories as interleavers. In the invention an iterative decoding procedure, which can be used in turbo decoding but is not limited thereto, enabling more efficient use of hardware, is presented. The invented method is based performing said first and second decoding step on the same hardware, said first and second decoding step exploiting the same single-port memory. Said hardware and said single-port memory are used in a feedback configuration. Note that the determining of the encoded signal by the decoding methods exploited in said iterative procedure can be denoted in this context soft decisions as in fact only an intermediate data element is determined. It is in the final step of the iterative procedure, when actually determining the best estimate of the decoded signal, that a hard final decision is taken.

In an embodiment of this aspect of the invention one recognizes that by considering said iterative performing said first decoding step and second decoding step together as a method step and applying said method step only on part of said encoded signal, then this method step will be smaller in size, thus needing smaller memories. The turbo decoding procedure can then be done by performing a plurality of such smaller size method steps, each comprising of iteratively performing first and second decoding steps, substantially simultaneously. Each of such smaller size method steps then has a memory, being assigned to it, and used for storage of the intermediate data elements, produced by it. Said memories are of the single-port type.

In a further embodiment of this aspect one recognizes the use of a flexible address generator. Indeed as said single-port type memory or storage unit should show interleaver functionality, flexible generation of addresses for storage in and retrieval out said memory is needed.

In a further embodiment of this aspect of the invention one considers further iterative performing of a plurality of decoding steps instead of said first decoding step and second decoding step only.

In another embodiment of this fourth aspect of the invention one recognizes that by considering said iterative performing said first decoding step and second decoding step together as a method step and by executing a plurality of such methods substantially simultaneously, one can decoded more than one sequence of blocks, related to said encoded signal, at a time, which again increases the efficiency of the hardware used. Naturally such an approach is not limited to two decoding steps but can be extended to a plurality of decoding steps.

In a fifth aspect of the invention essentially digital devices, being capable of executing the turbo decoding methods described above, are presented. Said digital devices are adapted such that they can either use said partial storage and recomputation based method and/or implement said so-called double flow methods and/or exploit parallelism and/or comprise of the hardware-memory feedback configurations discussed before.

In a sixth aspect of the invention parametric optimization of turbo decoding methods, being particularly adapted for providing sufficient degrees of freedom, is presented.

One embodiment of the invention provides methods for turbo decoding which is low power consuming, which has reduced memory requirements and shows enhanced performance with respect to the latency problem. Further embodiments being are also shown for execution of such low power consuming, less memory requiring methods with lower latency.

BRIEF DESCRIPTION OF THE DRAWINGS

FIG. 3 illustrates recalculation methods exploited in the presented turbo decoding methods. FIG. 3 shows a method wherein a metric is partially stored in a metric memory while it is computed during its generating recursion and while another metric is generated and consumed the not-stored values being located in between said stored metric are recomputed. In FIG. 3(a) said recomputed metric is stored while in FIG. 3(b) recomputation is each time restarted from a stored metric. The figure illustrates that in an apparatus being adapted for executing said methods memory for storage of partially stored metrics and possibly memory for storage of recomputed metrics are found. Said methods are characterized in that they can not store the full state metric sequence.

FIG. 4 shows a prior art turbo encoder (a) and a turbo decoder (b). One observes in said decoder two decoder modules (DEC1, DEC2) which are exploiting values from each other via the interleaver ($\pi$ and $\pi^{-1}$). Said decoder modules perform each substantially different decoding steps, each decoder module being assigned a particular decoding step.

FIG. 12 shows another embodiment of the invention wherein several compute and determining step are executed in a particular arrangement with respect to each other in order to facilitate transfer of valid initializations on the one hand and improving the memory requirements. Here 6 compute and determining steps are shown. This embodiment can also be parameterized as having (M=) 6 windows and (K=)3 sequential valid state metric sequence calculations after each other.

FIG. 13 shows embodiments of the invention with parameter values M=2, K=3. The memory size per dummy sequence is here 0.5 and 1 dummy sequence per output sequence.

FIG. 14 shows embodiments of the invention with parameter value K=4. The memory size per dummy sequence and the amount of dummy sequence per output sequence is indicated.

FIG. 19 presents the so-called sliding window approach.

FIG. 20 is an alternative representation of the decoding methods. In particular FIG. 20(c) represents the invented double flow decoding method.

DETAILED DESCRIPTION OF CERTAIN INVENTIVE EMBODIMENTS

Turbo decoding is characterized in that the received transmitted code is decoded by a first decoding step, resulting in a first decoded signal. Turbo decoding does not stop however after determining said first decoded signal. Instead a second decoding step resulting in a second decoded signal, is performed, said second decoding step exploits the received transmitted code and an interleaved version of the first decoded signal. Afterwards again said first decoding step is performed, exploiting said received transmitted code and an interleaved version of said second decoded signal. This procedure is iteratively and then the final decoded signal is determined.

Within turbo decoding schemes thus decoding steps can be distinguished. These decoding steps can be characterized as methods for determining a decoded signal from an encoded signal, being encoded by a turbo encoding scheme. In such a turbo decoding scheme, besides a step of inputting said encoded signal, a compute step and a determining step can be distinguished. Said determining step can be simultaneous, partly overlapping or after said compute step. In turbo decoding schemes said compute step is characterized by the computation of two vector sequences. One vector of such a sequence is denoted a state metric. Therefore in said compute step state metrics are determined. With first state metrics is meant a first vector sequence. With second state metrics is meant a second vector sequence. Said vector sequences are computed via recursions. With recursion is meant that the following vector in such a vector sequence is determined by at least the previous vector in said sequence. In turbo decoding schemes a forward recursion for determining said first state metrics and a backward recursion for determining said second state metrics are distinguished. The terms forward and backward refer to the order in which said encoded signal is inputted. Turbo decoding schemes are characterized by the fact that said decoded signal is being determined by combining said encoded signal, said first state metrics and said second state metrics.

Figure 1:
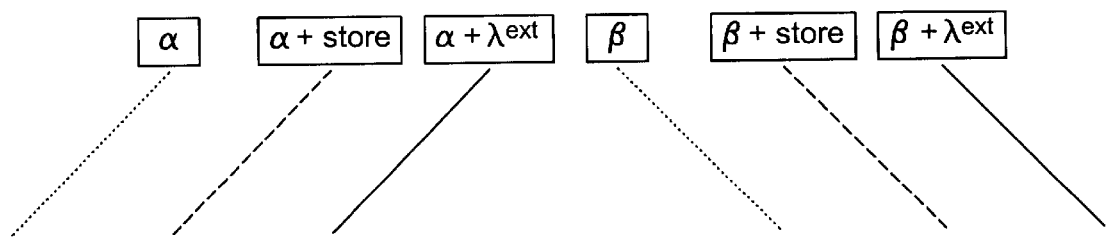
FIG. 1 shows a legend, to be used for representation of the turbo decoding methods, presented in the several aspects and embodiments of the invention. The horizontal dimension is related to execution time, while the vertical dimension relates to the index number of the state metric involved. Moreover this kind of representation provides in a clear way the particular ways in which the turbo decoding methods presented, deal with dummy or invalid metrics, valid and stored but not consumed metrics and valid and substantially direct consumed state metrics. This representation also allows representing in a visual way the forward recursion and the backward recursion involved in these turbo decoding methods.
Figure 18:
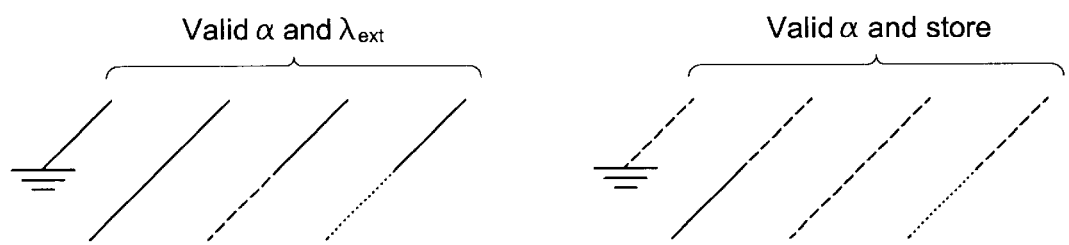
FIG. 18 is an alternative representation as in FIG. 1. Here the valid initializations are indicated with electrical grounding symbols.

In the further description said first state metric is denoted $\alpha$, while said second state metric is denoted $\beta$. $\alpha$ and $\beta$ are vectors with a fixed dimension and each part of a vector sequence. Thus a vector sequence of $\alpha$'s and a vector sequence of $\beta$'s can be distinguished. To each vector in such a sequence a number is assigned, indicating the place of said vector in its corresponding sequence. The aspects and the embodiments of the invention can be illustrated practically with graphical representations as shown in FIG. 1. The horizontal dimension of these representations relate to time. The more to the right a point in each of these representations is, the latter it occurs. The vertical dimension of these representations relate to the number of each vector in its corresponding sequence. A lower point in each of these representations have a lower number than the higher points in such a representation. The representations in FIG. 1 can thus be used for representing how the state metrics $\alpha$ and $\beta$ are computed and exploited as function of time. Note that $\alpha$ is in FIG. 1 relating to the state metric being determined with a forward recursion while $\beta$ is related to the state metric being determined with a backward recursion. Naturally interchanging the notation result in equivalent representations. In the above description a difference is made between (a) computing state metric, not storing and also not exploiting them, because they are invalid, (b) computing state metrics and storing them but not exploiting them for determining the decoded signal, and (c) exploiting them for determining said decoded signal. In FIG. 1 this is indicated by dotted, dashed and full lines respectively. FIG. 18 is an alternative representation, wherein electrical grounding and an opposite electrical grounding symbol, denoted valid or correct initializations.

In a first aspect of the invention particular ways of storing said vector sequences or state metrics in memories are presented. Indeed when one wants to determine said decoded signal from said encoded signal and said state metrics, and when said state metrics are not produced or computed at the same time as these state metrics are needed for consumption, storage of already computed state metrics is a possible way to go. As said vector sequences, exploited in turbo decoding schemes, are typically long, large memories, being power consumptive, are then needed. As low power implementation of turbo decoding schemes is aimed at in the invention, an alternative approach is presented. After inputting said encoded signal, said first state metrics is determined by a forward recursion. Said forward recursion is properly initialized. Said forward recursion exploits said inputted encoded signal. However not all said computed first state metrics or vectors are stored in a memory. Note that all said first state metrics should be computed one after another due to the forward recursion approach. In the invented approach however only part of said necessarily computed first state metrics is stored in a memory, denoted a first memory. With storing part of said computed first state metrics is meant that the amount of stored values is less than the total size or length of said vector sequence or first state metrics. In practice it is meant that an amount of stored values being substantially less then the total length is stored. After computing said first state metrics and stored part of them said second state metrics is computed with a backward recursion. When a particular state metrics of said backward determined state metrics becomes available, it can be almost directly exploited for determining said decoded signal from said encoded signal, said second state metrics and said computed first state metrics. Said second state metrics thus does not need a large memory as its consumption is scheduled near in time to its production. Said invented approach can be characterized in that only a part of said computed first state metrics is stored in a first memory, more in particular, in a memory being substantially smaller than the size or length of said first state metric sequence.

FIG. 3 gives graphical representations of the presented approaches. The top array shows the state metrics $\beta$ or the vector sequences of $\beta$'s. The higher the ordering number of a $\beta$ the more the $\beta$ is located at the right. The vector sequence is determined by initializing the most right $\beta$ and by determining $\beta$'s with a lower number from $\beta$'s with a higher number, thus with a backward recursion. FIG. 3 illustrates with the shaded boxes than only part of the computed $\beta$'s are stored in memory. It should be emphasized that the indicated top array is thus not completely stored in memory. When the vector sequence of $\beta$'s is determined, one starts computing the $\alpha$ sequence by initializing the one with the lowest number and using a forward recursion. If one want now to determine the decoded signal from the inputted encoded signal and both state metrics, one also needs the corresponding $\beta$, meaning the $\beta$ with the corresponding number. As said $\beta$'s are not all stored, some alternative approach should be used.

A possible approach is to determine the decoded signal directly from the stored $\beta$'s. This requires another type of computation or calculation. In fact one needs to compute a mathematical expression relating the decoded signal directly to said stored $\beta$'s. The extra computational effort, due to the increase in complexity of the mathematical expression to be computed, should be compared with the cost reduction due to the reduced memory requirements. It should be emphasized that in the representation of FIG. 3 $\alpha$ and $\beta$ can be reversed. Therefore this embodiment of this first aspect of the invention can be described also by stating that said decoded signal is determined by exploiting a calculation step, wherein said decoded signal is determined directly form said encoded signal, said second state metric and said computed first state metrics, being stored in said first memory.

Another possible approach is to determined the decoded signal from $\beta$'s, which are recalculated or recomputed. Representation (b) in FIG. 3 shows an approach wherein one determines the decoded signal from left to right, using forward recursions for $\alpha$ and one computes each time the $\beta$'s when needed. One notes that as one has to start from a stored one and because these $\beta$'s are computed with backward recursions, several compute steps are needed. Note that a small register file is exploited here for storage of one temporary $\beta$ value. It should be emphasized that in the representation of FIG. 3 $\alpha$ and $\beta$ can be reversed. Therefore this embodiment of this first aspect of the invention can be described also by stating that said decoding signal is determined from said encoded signal, said second state metrics and the needed first state metrics, itself being determined or recomputed. With said recomputation is not meant that said first state metrics is determined all over again, starting from the initialization. With recomputation is meant that first state metrics, being computed before but not stored, are recomputed from first state metrics, being computed and stored. More in particular first state metrics, not stored and lying in between or intermediate stored first state metrics are determined from the first state metrics, bounding the sequence of not-stored ones. One can then state that in said decoded signal determining step, explicitly recomputed first state metrics are used.

Another possible approach to determined the decoded signal from $\beta$'s, which are recalculated or recomputed. Representation (a) in FIG. 3 shows an approach wherein one determines the decoded signal from left to right, using forward recursions for $\alpha$ and one computes the $\beta$'s when needed but also temporary stores them. One notes that as one has to start from a stored one and because these $\beta$'s are computed with backward recursions, several compute steps are needed. Because now temporary storage is used instead of a small register for storage of one temporary $\beta$ value only, the amount of compute steps is reduced when compared to the approach of representation (b). It should be emphasized that in the representation of FIG. 3 $\alpha$ and $\beta$ can be reversed.

Therefore this embodiment of this first aspect of the invention can be characterized by stating said non-stored first state metrics are recomputed but one does not necessarily consume said recomputed values directly when producing or recomputing them. One stores said recomputed values in a second memory. In practice said recomputed values will be stored only temporary in said second memory. The size of said second memory will be substantially less than the size of said first state metric sequence. In an embodiment of the invention said second memory size will be equal or even less than the amount of non-stored first state metrics in between said stored ones. Said second memory can thus contain at most said intermediate first state metrics. The size constraint on said second memory results in overwriting said stored recomputed values.

In a second aspect of the invention particular ways of execution said state metric recursions and said decoded signal determination step are presented aimed at providing methods wherein a trade-off between latency and memory occupation can be made. In a traditional execution of a turbo decoding scheme one computes via a forward recursion said first state metrics, being validly initialized, and then one computes said second state metrics, being validly initialized, with a backward recursion. Simultaneously or after said second state metric computation, one determines said decoded signal. Executing turbo decoding schemes in such a way results in long latency and huge memories for storage of said state metrics and said inputted encoded signal. Another approach, denoted also as the use of overlapping windows, comprises the computation of one of said state metrics, with its corresponding recursion being validly initialized, while the other state metric is then determined a plurality of times but each time only part of said state metrics is determined and the recursions used therefore are not validly initialized. Recursions wherein only part of said state metrics is determined and which are not validly initialized are further denoted restricted recursions. The overlapping window approach can then be described as a method wherein one of said state metrics is determined completely with a validly initialized recursion while the other state metric is then determined a plurality of times with restricted recursion, determining only part of these state metrics. It should be emphasized that although so-called invalid initializations are used, the turbo decoding schemes show the property that after some recursion steps, said computed state metrics converge towards the state metrics expected when valid initializations were exploited. In so-called overlapping window approaches described above either one of said state metrics is determined completely and with a valid initialized recursions.

Figure 2:
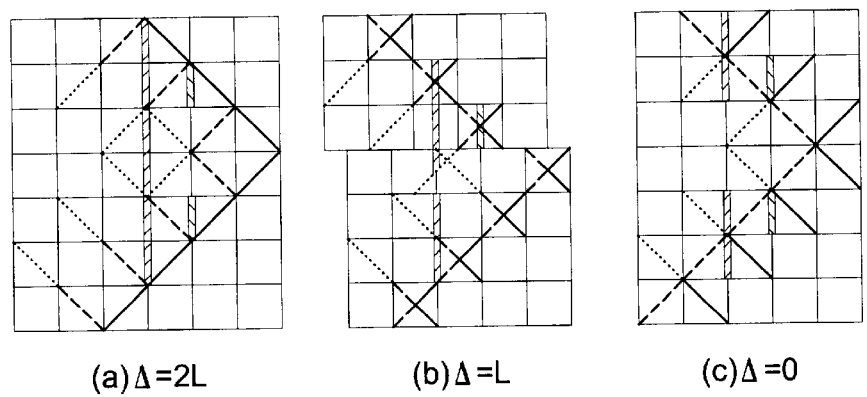
FIG. 2 shows three embodiments of the so-called double flow turbo decoding methods, being characterized in that for both said state metrics are only partially calculated with a validly initialized recursion, indicated with a solid line.

In the invention a method for turbo decoding is presented wherein for both state metrics (first and second) only part of these state metrics is determined with a validly initialized recursion, while the other parts, thus the one not determined by a validly initialized recursion, are being determined by restricted recursions. More in particular a plurality of said restricted recursions are needed. Execution of part of said restricted recursions are performed at the same time. FIG. 2 illustrates embodiment of this second aspect of the invention graphically. Note that dotted lines represent state metric computations which are not stored as they are invalidly initialized. The shown embodiment is characterized by the fact that for both said state metrics at least one recursion is validly initialized. In the representations in FIG. 2 this is done by starting the forward recursion at the beginning of the corresponding vector sequence, thus at the bottom of the representation and the backward recursion at the end of the corresponding vector sequence, thus at the top of the representation. One recognizes these validly initialized recursions (starting at the top or at the bottom) do not cover the whole vector sequence, thus only part of the state metrics are determined by such a recursion. The other parts should then be determined by other recursions, here denoted restricted recursions, as they only determine part of said state metrics and are invalidly initialized. One recognizes these restricted recursions as combined dotted-dashed lines. Note that said validly initialized recursion can either only compute and store or also compute and determine the decoded signal, depending of the particular embodiment. Note that each embodiment requires another size of memories for storing state metrics, being computed but not consumed yet and for temporary storage of the inputted encoded signal, which is also needed for determining state metrics and for determining said decoded signal. FIG. 2 gives an indication of the size of the required memories. FIG. 20(c) shows an alternative representation of the embodiment above, by only showing the recursion of the validly initialized metric.

Figure 21:
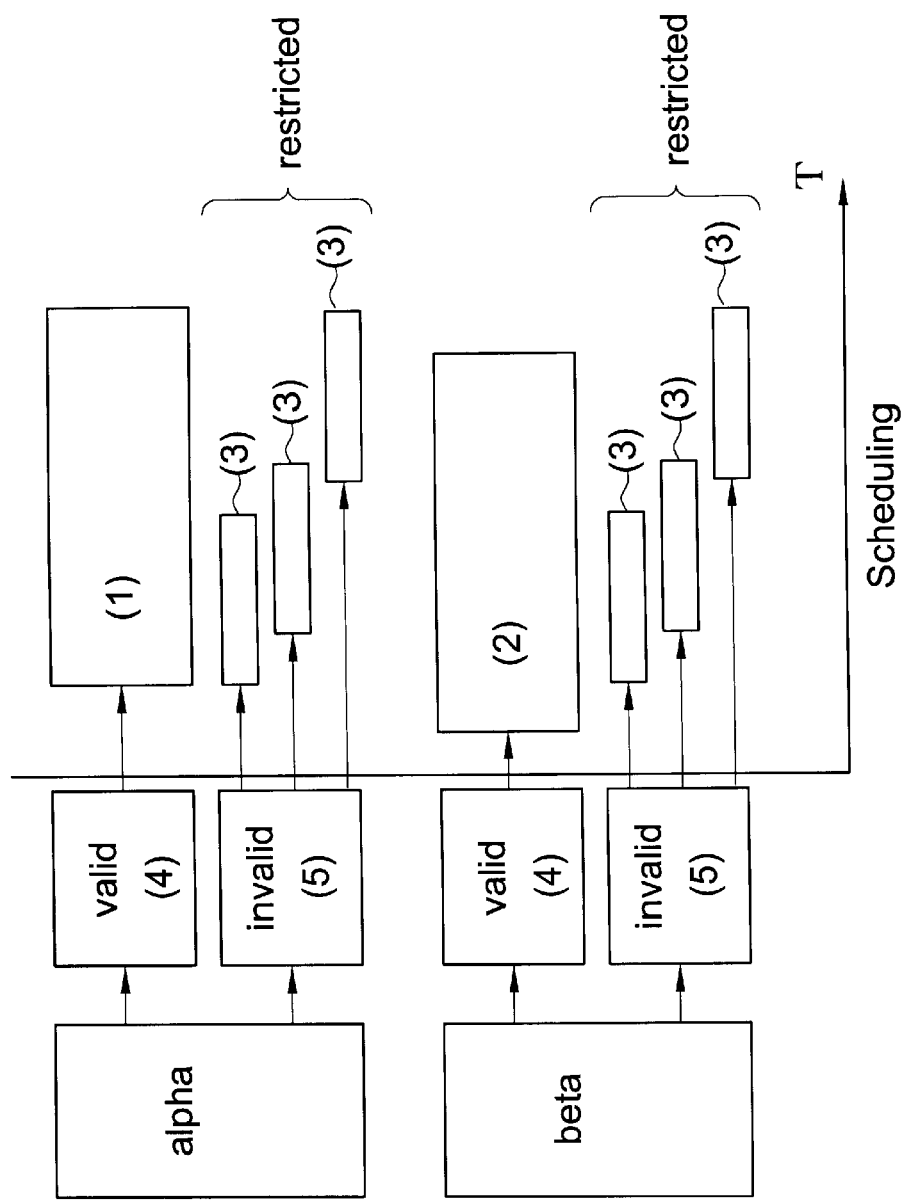
FIG. 21 shows another representation of the so-called double flow approach. Two classes of state metrics are distinguished. The first state metrics, to be determined with a forward recursion, is denoted ALPHA while the second state metrics, to be determined with a backward recursion, is denoted BETA. Both classes can be further separated in subclasses. One subclass contains metrics (4) which are determined by a validly initialized recursion (1)(2) while the other subclass contains metrics (5) which are not determined by such a validly initialized recursion. These metrics (5) are then determined by a plurality of recursions (3), also denoted restricted recursions, which are not validly initialized and which themselves only determine part of the metrics (5).

FIG. 21 shows another representation of this second aspect of the invention. Two classes of state metrics are distinguished. The first state metrics, to be determined with a forward recursion, is denoted ALPHA while the second state metrics, to be determined with a backward recursion, is denoted BETA. Both classes can be further separated in subclasses. One subclass contains metrics (4) which are determined by a validly initialized recursion (1)(2) while the other subclass contains metrics (5) which are not determined by such a validly initialized recursion. These metrics (5) are then determined by a plurality of recursions (3), also denoted restricted recursions, which are not validly initialized and which themselve only determine part of the metrics (5). Although not explicitly drawn in FIG. 21 it should be emphasized that these recursions can partly determine the same metrics (5), although at another time instance. Thus these restricted recursion can overlap with respect to the range of the state metrics. The right-hand side of FIG. 21 shows the scheduling of the different recursions. It is shown that said validly initialized recursions (1) and (2) are executed substantially simultaneously. It is also shown that said restricted recursions (5) are partly executed simultaneously. Note that said restricted recursions always determine in a sequence of first iterations dummy or invalid state metrics and a further sequence then valid state metrics. More in particular one relies here on the property that such an non-validly initialized recursion asymptotically converges towards valid state metrics and when the difference between state metrics determined by such a restricted recursion and the theoretically expected ones is below a certain threshold said restricted recursion state metrics are considered to be valid.

Figure 8:
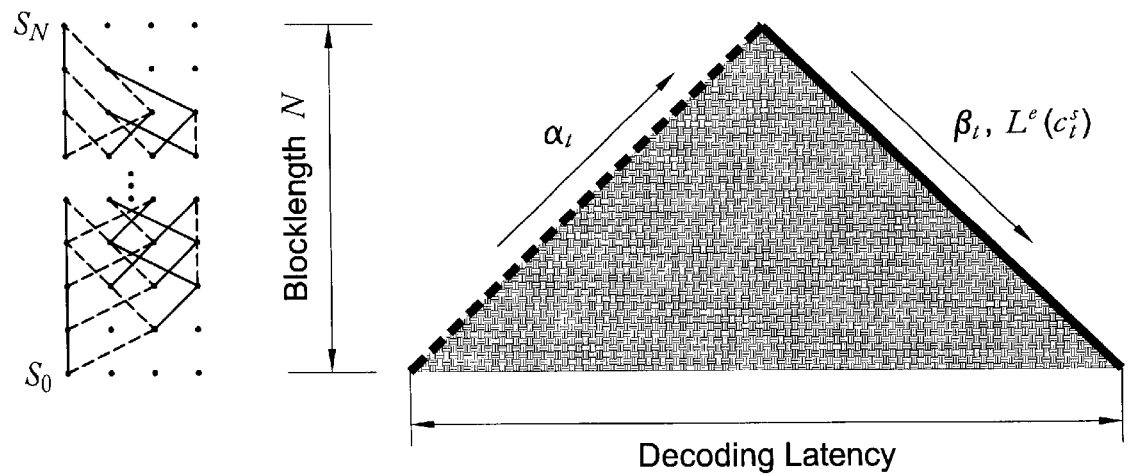
FIG. 8 illustrates a prior-art execution of a typical decoding method, being exploited in turbo decoding. One recognizes a first forward recursion and a second backward recursion, both being validly initialized and covering the full length N of the state metrics. Said first forward recursion is characterized in that the state metrics being determined is not consumed for determining said decoded signal immediately, as indicated by the dashed line. The shading of the figure indicates storage requirements.

In a third aspect of the invention particular methods for turbo decoding, comprising essential of turbo decoding method steps of smaller sizes are presented. A turbo decoding method determines in principle a decoded signal by combining an encoded signal, first state metrics and second state metrics. Said metrics are computed via a forward or a backward recursion. Said recursions in principle need to be validly initialized. FIG. 8 shows a graphical representation of the above described turbo decoding scheme, wherein the first state metric $\alpha$, being a part of a vector sequence of length N, is computed with a forward recursion but not consumed for determining the decoded signal. In the drawing this is represented by the dashed lines. When the first state metric is determined one starts computing $\beta$ with a backward recursion and consumes it for determining the decoded signal. In the drawing the full line is used for representation. One observers a latency along the horizontal axis, indicating time, proportional with 2N. The shaded area indicates memory requirements as function of time needed for storage of the first state metrics.

Figure 9:
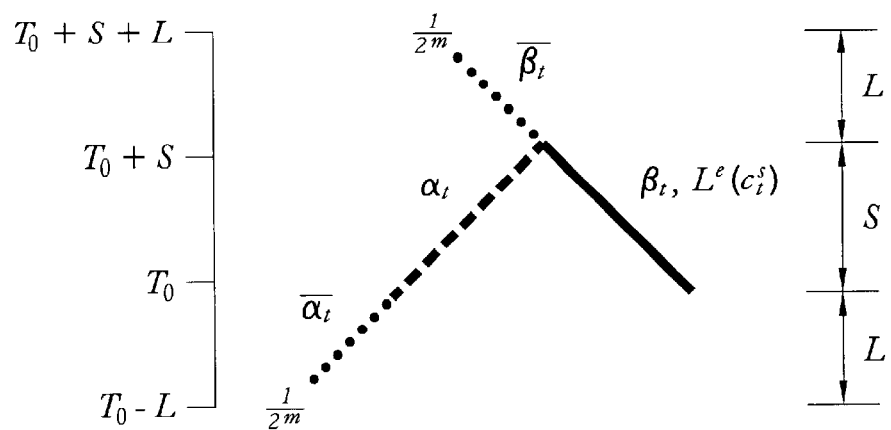
FIG. 9 illustrates a compute and determining step being exploited in turbo decoding methods according to the invention. Said compute and determining step shows also a first forward and a second backward recursion, but both said recursions are not validly initialized and are not covering the full length N of the state metrics but only a part S substantially smaller then N. Note that L refers to the dummy metrics sequence, indicated by dotted lines, needed due to invalid initializations.

However because even invalidly initialized recursions converge after some dummy state metric computations towards valid values of state metrics, one can work with invalidly initialized recursions also, as pointed out in the embodiments discussed above. FIG. 9 shows a representation thereof. A first state metric is determined with a forward recursion, starting with an invalid initialization. One computes some dummy metrics, indicated by the dotted lines, and obtains after a while valid metrics, not consumed yet, as indicated by the dashed lines. The second state metric is determined with a backward recursion, starting with an invalid initialization. One computes some dummy metrics, indicated by dotted lines, and obtains after a while valid metrics, which can be consumed directly, indicated by the full line, as the corresponding first state metric is also already available. Note a valid interval of length S and dummy sequences of length L can be distinguished.

Figure 10A:
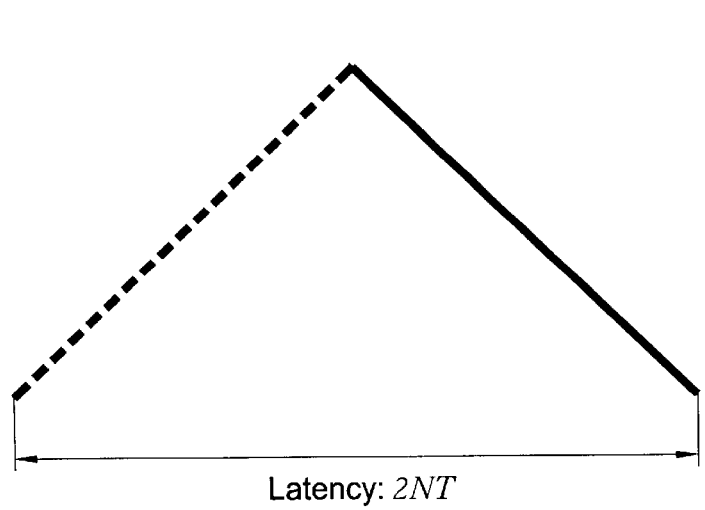
FIG. 10(a) shows again the prior art execution of a typical decoding method as explained in FIG. 8.
Figure 10B:
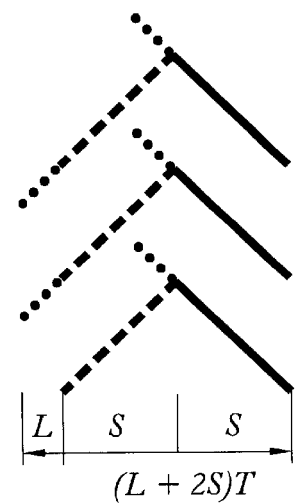
FIG. 10(b) illustrates an embodiment of a turbo decoding method according to the invention, wherein a plurality of said compute and determining steps are executed substantially simultaneously.

When for both recursions invalid initializations are used, one can split up the turbo decoding method in a plurality of turbo decoding method steps of smaller sizes, meaning that the vector sequences or state metrics in such methods are of smaller length. In principle said state metrics of such method of smaller size together define the fill state metrics, except that some dummy metrics are computed also. It can be stated that the turbo decoding method comprises of executing a plurality of compute and determining steps. Each of said compute and determining steps comprising of computing part of said first state metrics with a forward recursion and part of said second state metrics with a backward recursion, and determining part of said decoded signal by combining part of said encoded signal, part of said first state metric and part of said second state metric. FIG. 10(b) shows such parallel execution in comparison with the standard method, shown in FIG. 10(a). Note that the latency is reduced here and is proportional with L+2S.

Figure 11A:
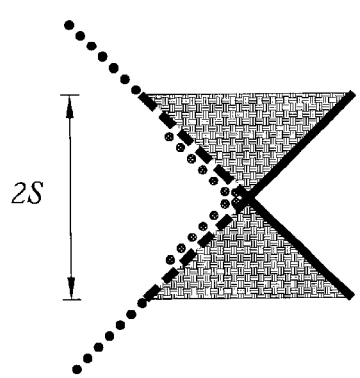
FIG. 11(a) shows two substantially simultaneously executed compute and determining steps, being reversed with respect to each other, and being scheduled such that they provide valid initializations to each other. The light dotted line indicate dummy state metrics, which do not need to be determined anymore due to this particular arrangement. The memory requirements of this approach is indicated by the shading.

Although said compute and determining steps can be seen as totally separate methods, in the invention particular scheduling of these compute and determining steps are proposed such that said methods support each other, by providing valid initializations to each other. FIG. 11 gives graphical representations of these.

Figure 11B:
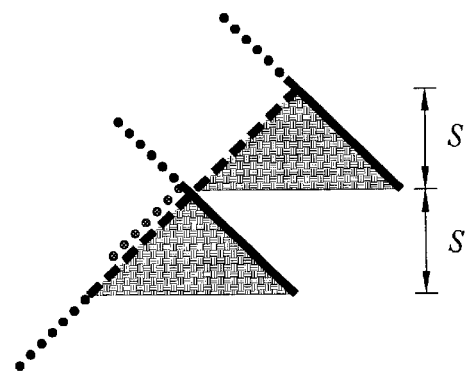
FIG. 11(b) shows two time deferred and thus partially overlapping in time compute and determining steps, being reversed with respect to each other, and being scheduled also such that they provide valid initializations to each other. This arrangement is such that said two compute and determining steps can share a common storage unit, because their peak in memory requirement as function of time is at a substantially different time. Again this is indicated by shadings.

In an embodiment of this third aspect of the invention at least two of these compute and determining steps are executed or scheduled such that these are performed partially overlapping in time. FIG. 11(b) shows this embodiment. FIG. 11 (a) is an extreme case of this, as both compute and determining steps are executed simultaneously there.

In another embodiment of this third aspect of the invention at least two of said compute and determining steps being scheduled such that initialization of one of said recursions for said computing state metrics of one of said compute and determining steps being based on a computed value of said recursion of said state metrics in the other compute and determining step. FIG. 11(b) shows that the first compute and determining step, shown by the bottom left triangle, produces valid a values, with can be used for initialization of the top right triangle, being a second compute and determining step. Therefore said second compute and determining step does not need to compute the dummy values, indicated by the light dotted lines.

Note that in FIG. 11 the shaded area indicates the memory requirements as function of time. One observes the trade-off between gaining some calculation effort (dummy metric computation), latency and memory requirements.

In a further embodiment of this third aspect of the invention one recognizes that intelligent scheduling of compute and determining steps is not necessarily limited to two of said steps. Scheduling of these steps such that these are at least partially overlapping is preferred, in particular when the time delay between the start of each of said steps is selected to be $\pm k(ST)$, with k a natural number, S the size of the metric determined in such a step, T the time unit for determining one metric calculation. This restriction enables exchange of information, thus metric initialization, between these steps. An example of such scheduling of more than two compute and determining steps is shown in FIG. 12, showing 6 windows in a single combination and 3 sequential computations of valid state metrics. The grey dotted lines indicate metric reuses between the different windows. Such a combination of compute and determining steps is further denoted combined compute and determining step, being characterized by two parameters. The first parameter M denotes the amount of windows, or compute and determining steps, in such a combination, while the second parameter K, denotes the amount of sequentially executed valid metric calculations. Note that the latency of such a combination can be expressed as $(L+KS)T$, with L referring to the dummy metric sequence.

In a further embodiment some particular combinations of these compute and determining steps are selected based on optimization of both the latency of the resulting decoding method, the number of dummy sequences per output sequence and the memory size per dummy sequence.

In an aspect of the invention a combination with parameter K=2 is selected. Such a combination is graphically depicted in FIG. 11(a). Note that said method has one dummy sequence per output sequence and no memory reuse is exploited here.

In an aspect of the invention a combination with parameter K=3 is selected. Such combinations are graphically depicted in FIGS. 13 and 11(b). The memory size per dummy sequence is here 0.5 and 1 dummy sequence per output sequence.

In an aspect of the invention a combination with parameter K=4 is selected. Such combinations are graphically depicted in FIG. 14. The structure in FIG. 14(a) has 0.5 dummy sequences for one output sequence. This structures minimizes the number of computations of dummy metrics. The structures in FIGS. 14(b) and (c) on the other hand show better memory reuse characteristics. Note that the grey shaded areas symbolize the memory space needed as function of time. Two memories for storage of state metrics while computing six output sequences is found for these last structures, at the expense of a little more dummy sequences per output sequence (2/3).

Figure 15:
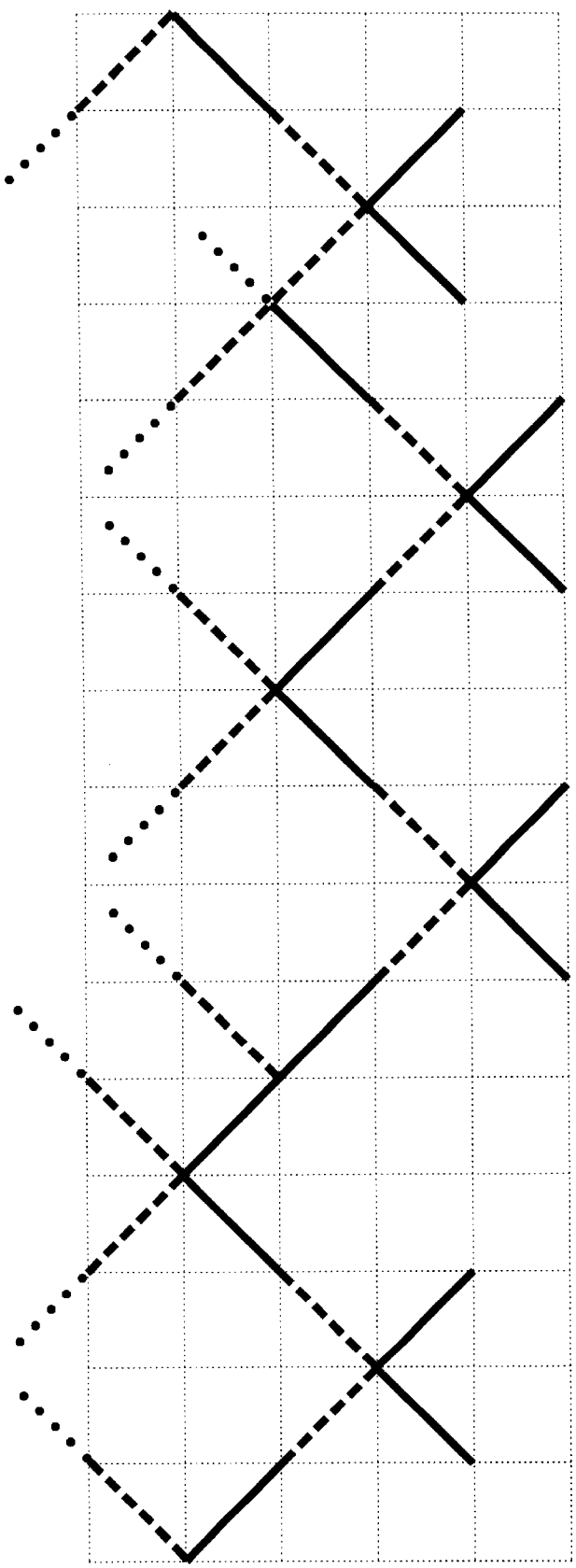
FIG. 15 shows embodiments of the invention with parameter value K=5. The memory size per dummy sequence and the amount of dummy sequence per output sequence is indicated.

In an aspect of the invention a combination with parameters K=5 is selected. An example with M=16 is shown in FIG. 15.

Figure 16:
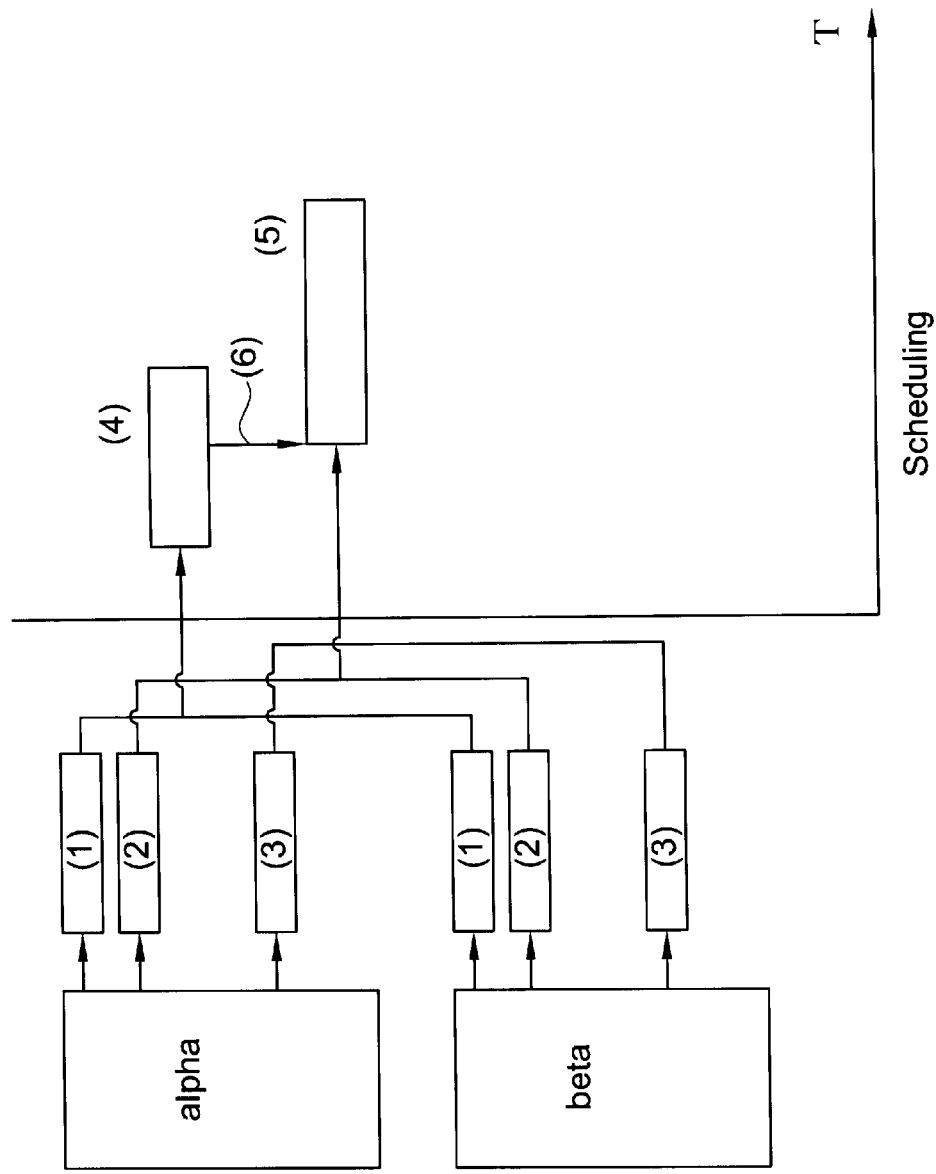
FIG. 16 shows the first state metrics ALPHA, being determined with a forward recursion, are being divided in sets or classes (1)(2)(3). The second state metrics BETA, being determined with a backward recursion, are also divided in sets or classes (1)(2)(3). The first state metrics of one of such sets and the second state metrics of the corresponding set are computed both by a compute and determining step (4)(5). There are a plurality of such compute and determining steps. Observe that the compute and determining step (4) provides an input (6) to compute and determining step (5), more in particular for providing a valid initialization to step (5). Note that said compute and determining steps (4)(5) are being scheduled such that said steps are executed at least partially overlapping in time.
Figure 17:
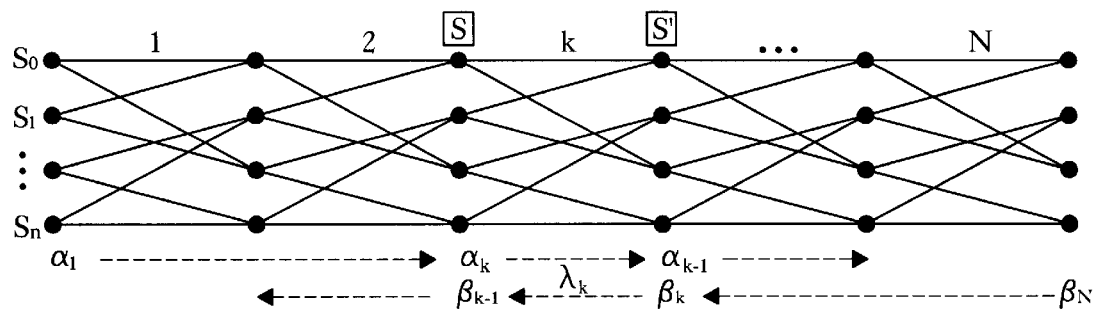
FIG. 17 illustrates an interpretation of the two state metrics, in a so-called trellis graph.

Said third aspect of the invention is in an alternative way represented in FIG. 16. The first state metrics ALPHA, being determined with a forward recursion, are divided in sets or classes (1)(2)(3). The second state metrics BETA, being determined with a backward recursion, are also divided in sets or classes (1)(2)(3). The first state metrics of one of such sets and the second state metrics of the corresponding set are computed both by a compute and determining step (4)(5).

There are a plurality of such compute and determining steps. Observe in FIG. 16 that the compute and determining step (4) provides an input (6) to compute and determining step (5), more in particular for providing a valid initialization to step (5). Note that said compute and determining steps (4)(5) are being scheduled such that said steps are executed at least partially overlapping in time.

In the fourth aspect of the invention a method for iterative decoding. Turbo decoding is characterized by performing a first decoding step followed by a second decoding step, and iteratively performing these two decoding steps. After loading or inputting the encoded signal, a first decoding step is performed, which produces or determines a first intermediate data element. The second decoding step exploits an interleaved version of said first intermediate data element in order to produce or determine a second intermediate data element. With interleaved version is meant that essential the same values are stored in said data element but the ordering within said data element, being a vector, is changed. After this said first decoding step is performed again, exploiting an interleaved version of said second intermediate data element.

As said first decoding step exploits data from said second decoding step and vice versa, these decoding steps are not performed simultaneously. Therefore when said first decoding step is executed by a first circuit and said second decoding step is performed by second circuit, only one of said circuit is executing its operation at the same time. Therefore no efficient use of the available hardware is obtained.

Figure 5A:
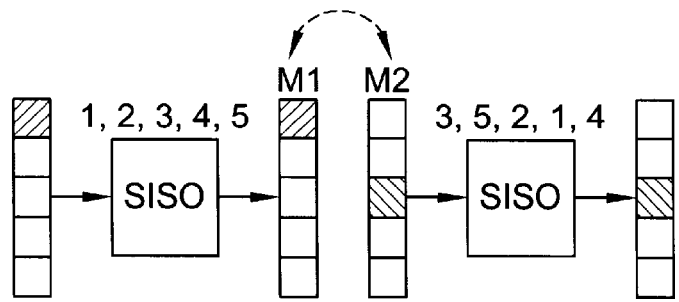
FIG. 5(a) shows the operation of a turbo decoder as shown in FIG. 4(b). A first decoder consumes values according to a first decoding method and stores these in a first order in a memory. The second decoder consumes in a further step said produced values in a second order, being substantially different from said first order, and produces according to a second decoding method, substantially different from said first decoding method and stored them in a memory.
Figure 5B:
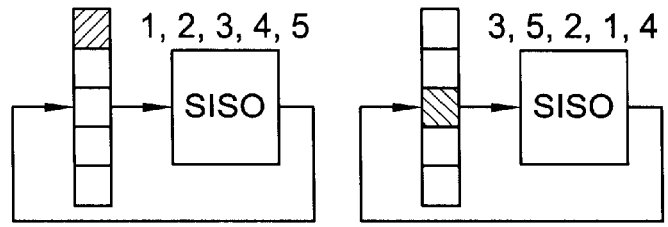
FIG. 5(b) illustrates the operation of a turbo decoder according to an embodiment of the invention. A turbo decoder setup wherein a single decoder module, performing a decoding method, has a single memory, being organized in a feedback arrangement. The right and left picture in FIG. 5(b) show the operation of the same decoder module but during a time slot. Note that said decoder module can thus execute two substantially different decoding steps.

FIG. 4 shows a graphical representation of a classical turbo decoding setup. One recognizes a first decoder, denoted DEC1 which performs a first decoding step and a second decoder, denoted DEC2, which performs a second decoding step. Feedbacks between said decoders are indicated. In these feedbacks blocks, denoted by $\pi$ and $\pi^{-1}$, are shown, representing interleavers. FIG. 5($a$) shows how classical the interleavers can be implemented. The first decoder (at the left), here for a SISO decoder, produces outputs in a first ordering and stores these outputs in a first memory M1, big enough to store these outputs. The second decoder (at the left), here also a SISO decoder, consumes later inputs, obtained during a previous iteration from the first decoder and stored in a second memory M2. Said input consumption is done according to a second ordering, being substantially different from said first ordering.

In the invention an iterative decoding procedure, as used in turbo decoding, wherein better hardware efficient is obtained, is presented. The invented method is based on performing said first and second decoding step on the same hardware. As no simultaneous writing and reading is necessary, and because said decoupled steps can not overlap in time, one memory of the size of a data element, is sufficient. This is represented in FIG. 5($b$) showing a single decoder, here a SISO decoder, but the invention is not limited thereto. In a first iteration, shown in FIG. 5($b$), leftside this decoder performs a first single decoder step, and during this single decoder step, it read and writes to the same memory in a particular order. In a second iteration, shown in FIG. 5($b$), rightside the same decoder performs also a second single decoder step, being substantially different than said first single decoder step. During said second iteration the decoder reads and writes to the same memory as in the first iteration but another reading and writing ordering is used. Note that it is sufficient to have a memory with a single port here. A flexible address generator is exploited to enable interleaver functionality of said single-port memory.

Figure 6:
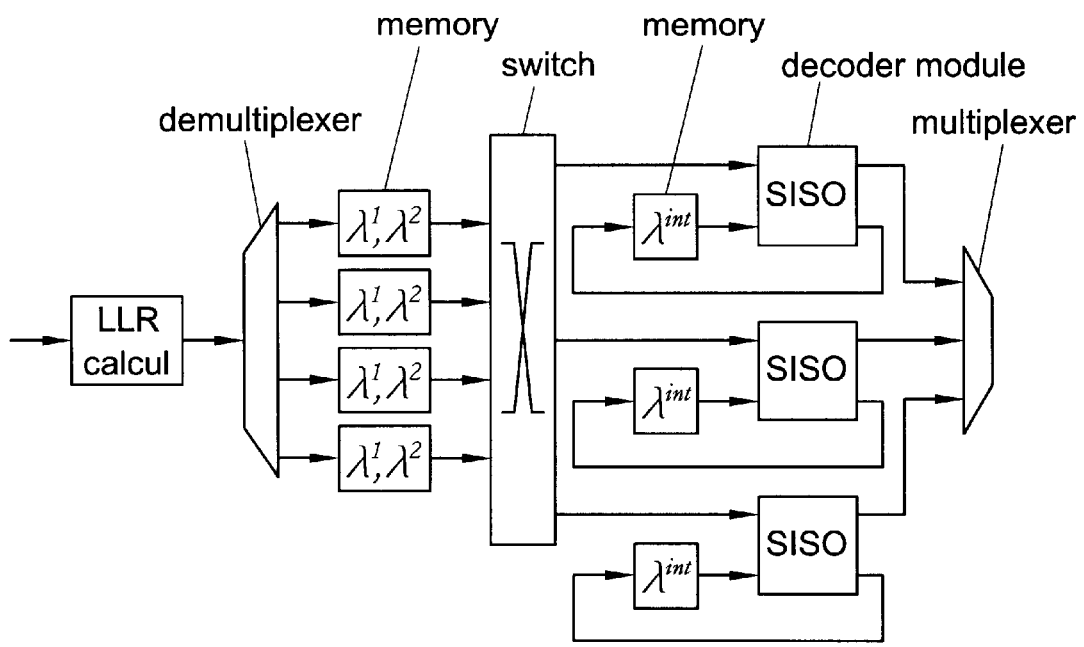
FIG. 6 shows then a turbo decoder setup wherein the principle of FIG. 5(b) is expanded by showing a plurality of decoding modules, each being arranged in a feedback arrangement with a memory dedicated or assigned to each decoding module. Further one recognizes multiplexers and demultiplexers. All of said decoding modules are adapted such that they can execute a plurality of decoding methods in different time slots. The proposed set-up or apparatus is an essentially digital device and is particularly suited for executing the turbo decoding methods proposed in the different aspects and embodiments of the invention.

In an embodiment of this aspect of the invention one recognizes that by considering said iterative performing said first decoding step and second decoding step together as a method step and applying said method step only on part of said encoded signal, then this method step will be smaller in size, thus needing smaller memories. The turbo decoding procedure can then be done by performing a plurality of such smaller size method steps, each comprising of iteratively performing first and second decoding steps, substantially simultaneously. Each of such smaller size method steps then has a memory, being assigned to it, and used for storage of the intermediate data elements, produced by it. This is illustrated in FIG. 6, showing a set-up wherein a plurality of blocks, each comprising of a decoder module and a memory being connected in a feedback arrangement. Each of said decoder modules is being adapted such that it can perform a plurality of decoding steps. More in particular said plurality of decoding steps are performed iteratively. Thus in a further embodiment of this aspect of the invention one considers further iterative performing of a plurality of decoding steps instead of said first decoding step and second decoding step only.

In another embodiment of this aspect of the invention one recognizes that by considering said iterative performing said first decoding step and second decoding step together as a method step and applying each of said method steps on the complete encoded signal, one can decoded a plurality of encoded signals simultaneously with the same hardware. This again results in an increase of hardware efficiency. Again this is illustrated in FIG. 6, showing a set-up wherein a plurality of blocks, each comprising of a decoder module and a memory being connected in a feedback arrangement. Each of said decoder modules is being adapted such that it can perform a plurality of decoding steps on an encoded signal. Each of said decoder is dealing with another encoded signal.

In a fifth aspect of the invention architectures, which implements the presented decoding methods described above, are presented.

Figure 7:
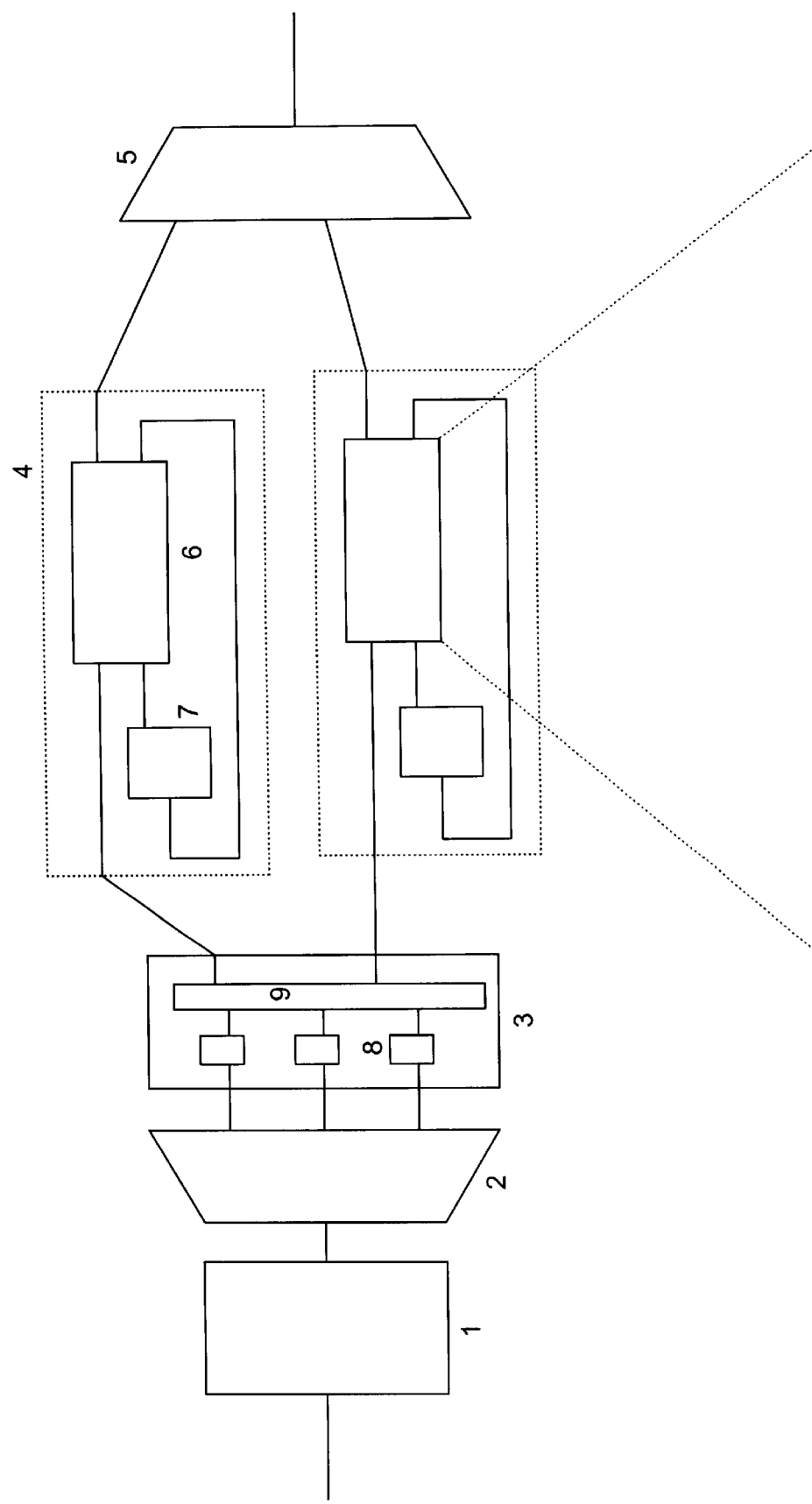
FIG. 7 shows another representation of the invented turbo decoder setup.

In a first embodiment of this aspect of the invention an architecture, shown in FIG. 7, being closely related to the hardware efficiency aspect described above, is disclosed. Such an apparatus determining a decoded signal from an encoded signal, and is being adapted for inputting said encoded signal and outputting said decoded signal. Said apparatus comprises of a plurality of parallel modules (4). Each of said modules is adapted for performing decoding.

In a further embodiment each of said modules comprises of a decoder module (6) with at least two inputs and at least two outputs. A feedback connection or loop is made between one of said module inputs and one of said module outputs but a memory (7), being assigned to said decoder module, is incorporated within said feedback connection.

In a still further embodiment each of said modules is adapted for performing an iterative decoding method on parts of said encoded signal, said iterative decoding method comprising iteratively performing a sequence of decoding steps, wherein each of said decoding steps exploits an interleaved version of the intermediate data elements, being produced by the preceding decoding step, said data elements being stored in and read from the memory, being assigned to the iterative decoding method.

In a further embodiment said memory in said feedback connection is a single-port memory.

In another embodiment of this aspect of the invention the apparatus determines a plurality of decoded signals from a plurality of encoded signals. Said apparatus comprises of a plurality of parallel modules (4). Each of said modules is adapted for performing decoding of one encoded signal.

It should be emphasized that with memories here is meant any kind of storage unit.

In a further embodiment an apparatus for turbo decoding as shown in FIG. 7, being adapted for inputting an input signal and outputting an output signal, said input signal being a turbo encoding signal, comprising of a sequence of blocks, each of said blocks comprising of Nb samples, said apparatus comprising of a first module (1) with at least as input said input signal, further being adapted for determining reliability measures on said input signal; a second module (2), being adapted for demultiplexing the first module output in N second module outputs; a storage unit (3); a plurality of third modules (4), each of said third modules having at least a module input and a module output, each of said third modules being adapted for performing decoding of one of said blocks; and a fourth module (5), being adapted for multiplexing the module outputs of said third modules, having as output said output signal, is presented. In said apparatus said reliability measures are log likelihood ratios.

Said apparatus for turbo decoding has an amount of third modules being an integer and said storage unit is being adapted for inputting said N second module outputs and outputting M storage unit outputs, each of said M storage unit outputs being an input of a separate third module. Said storage unit comprises of N first memories (8) and a N to M switch (9), M being N−1 or wherein N being larger than or equal to M.

Said apparatus for turbo decoding is further characterized in that said decoding in said third modules comprises an iterative sequence of a set of ordered tasks. Each of said third modules comprises of a decoder module (6) with at least a first input, a second input, a first output and a second output, said decoder module being adapted for executing said ordered tasks one after another; a second memory (7) with at least a memory input and a memory output; and said first input being said third module input, said second input being said memory output, said first output being said third module output and said second output being said memory input.

In said apparatus said second memories are single port memories. Further a flexible address generator, being adapted for enabling interleaver functionality of said single port memories, is foreseen.

In a second embodiment of this aspect of the invention an architecture, being closely related to the parallisation aspect described above, is disclosed. Said apparatus determines a decoded signal by combining an encoded signal, first state metrics, being determined with a forward recursion, and a second state metrics, being determined with a backward recursion. Said apparatus is adapted for scheduling a plurality of compute and determining steps, wherein each of said compute and determining steps comprising of computing part of said first state metrics with a forward recursion and part of said second state metrics with a backward recursion, and determining part of said decoded signal by combining part of said encoded signal, part of said first state metric and part of said second state metric. Said apparatus schedules at least two of said compute and determining steps such that initialization of one of said recursions for said computing state metrics of one of said compute and determining steps being based on a computed value of said recursion of said state metrics in the other compute and determining step.

In a further embodiment dedicated modules for each of said compute and determining steps are foreseen. Each of said modules is thus being adapted for executing one of said compute and determining steps. Moreover said apparatus schedules at least two of said compute and determining steps such that execution of said two steps being partially overlapping in time.

In an even further embodiment said dedicated modules are sharing memory. More in particular the scheduling of said compute and determining step, executed by said modules, is done such that at least two of said modules share a memory for storage of state metrics, computed by said modules. Said shared memory is substantially smaller than two times the size of said state metrics.

In a third embodiment of this fifth aspect of the invention architectures, being related to said recomputation methods, are presented. Said architectures are characterized in that a memory is assigned for storing part of said computed state metrics. The size of said memory is substantially smaller than the size needed for storing all said computed state metrics.

In a further embodiment even a second memory for temporary storing recomputed state metrics is provided, the size of this second memory being such that it can at most store the amount of state metrics that need to be recomputed in between said stored state metrics.

In a fourth embodiment of this fifth aspect of the invention architectures, being related to said double flow turbo decoding methods, are presented. Said architecture is characterized in that it is being adapted for inputting said encoded signal, computing first state metrics with a forward recursion and second state metrics with a backward recursion, part of each of said state metrics is being determined by a validly initialized recursion, the part of the state metrics not determined by a validly initialized recursion is being determined by performing a plurality of restricted recursions, said restricted recursions only determining part of these state metrics, and determining said decoded signal by combining said encoded signal, said first state metric and said second state metric.

In a further embodiment the apparatus has at most two memories assigned for storage of valid state metrics being determined by said restricted recursions. The size of said memories is the size of the valid state metrics being determined by one of such a restricted recursion.

In a sixth aspect of the invention optimization of parameters of a turbo decoding method, being adapted such that extra parametric freedom is available, is presented. Indeed performance in terms of power or energy consumption, latency, memory requirements are dependent on the selected parameters. Said parameter or degrees of freedom are selected by optimizing a cost function incorporating at least one performance criteria such as power or energy consumption, latency and memory requirements. It should be emphasized that said parametric optimized turbo decoding method can be implemented in a custom essentially digital device or in general purpose device or in a combination thereof. In particular embodiment while designing the turbo decoding implementing device, one performs optimization of parameters of a turbo decoding method, and selects optimal value of said parameters, thereby thus defining said selected parameters, and one designs said device dedicated for a method with said selected parameters. In an other embodiment one still performs optimization of parameters of a turbo decoding method, but one selects a range of optimal values. One designs a device which can perform said turbo decoding method for said range of values and for instance based on the available resources, e.g. memory parameters are selected within the optimal range. Further said parameter values can be changed on the fly, while executing the turbo decoding functionality of said device, based on a change of available resources, e.g. memory can be shared with other processes executed by said device or because the performance requirements changes as function of time.

In an embodiment of this sixth aspect of the invention one of said selected parameters is the parameter indicating how many state metrics are partially stored. This optimization refers to the partial storage and recomputation aspect of the invention.

In another embodiment of this sixth aspect of the invention one of said selected parameters is the parameter indicating the relative amount of dummy, invalid metrics per amount of valid metrics. This parameter is highly related to the decoding performance. Note that this parameter can be defined as the length of sequence of valid metrics divided by the length of the sequence of dummy metrics.

In yet another embodiment optimization of the parameter M denoting the amount of windows, or compute and determining steps in said parallelisation aspect of the invention is presented.

In an another embodiment optimization of the parameter K, denoting the amount of sequentially executed valid metric calculations, in said parallelisation aspect of the invention, is disclosed.

It should be emphasized that optimization of any combination of the above mentioned parameters can be done also.

The possibilities to obtain valid ALPHA metrics are plotted in FIG. 18. For BETA metrics the possibilities are totally equivalent of course.

Figure 22:
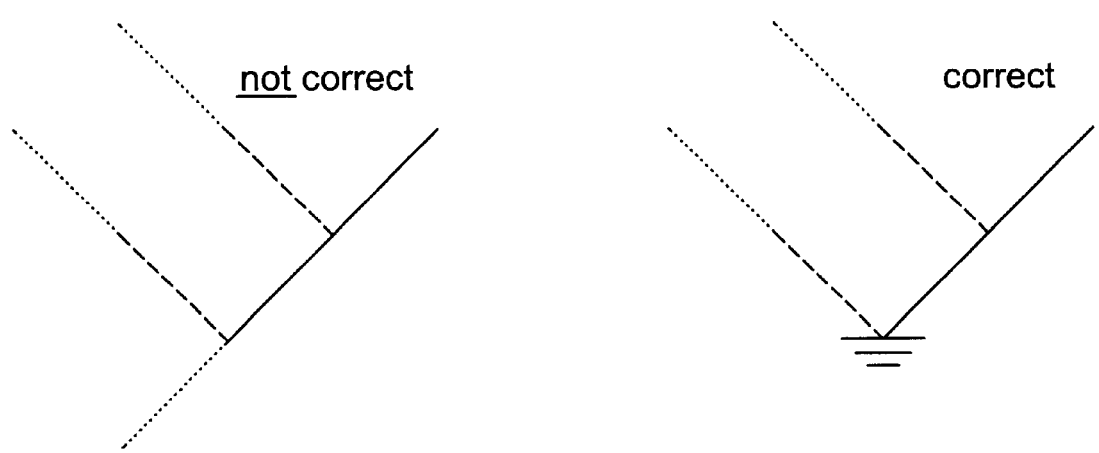
FIG. 22 is a graphical representation of two possible algorithms.

The second restriction is based on the fact that windowing two state metrics results in performance degradation. When both the ALPHA and the BETA metrics have been calculated by dummy values first in order to obtain valid values, the performance of the decoding algorithm drops. By demanding that not both state metrics are windowed, at least one of these state metrics is calculated starting from a real initial condition. Such a real initial condition is graphically represented by electrical ground symbol or an opposite electrical ground symbol. These symbols therefore also represent the beginning and end of a data block of size N. FIG. 22 gives an example of a correct and an incorrect algorithm according to this restriction. This second restriction boils down to the fact that only three possible structures are possible.

I claim:

1. A method of determining a decoded signal from an encoded signal, the method comprising:

receiving the encoded signal;

performing a first decoding so as to determine a first intermediate data element, wherein the first intermediate data element is stored in a memory, and wherein the first decoding is based on the encoded signal;

performing a second decoding so as to determine a second intermediate data element, wherein determining the second intermediate data element is based on the encoded signal and an interleaved version of the first intermediate data element that is read from the memory, and wherein the second intermediate data element is stored in the memory;

iteratively performing the first decoding and second decoding, wherein the first decoding exploits an interleaved version of the second intermediate data element, wherein the second intermediate data element is read from the memory and wherein the first intermediate data element is stored in the memory, wherein the second decoding exploits an interleaved version of the first intermediate data element that is read from the memory, and wherein the second intermediate data element is stored in the memory; and determining the decoded signal from either the first or the second intermediate data elements.

2. The method of claim 1, wherein the memory is a single port memory.

3. A method of determining a decoded signal from an encoded signal, the method comprising:

receiving the encoded signal;

performing substantially simultaneously a plurality of iterative decoding methods on parts of the encoded signal, wherein each of the iterative decoding methods comprises:

performing a first decoding so as to determine, based on part of the encoded signal, a first intermediate data element, wherein the first intermediate data element is stored in a memory that is assigned to an iterative decoding method on part of the encoded signal;

performing a second decoding so as to determine, based on part of the encoded signal and an interleaved version of the first intermediate data element, read from the memory, a second intermediate data element, wherein the second intermediate data element is stored in the memory;

iteratively performing the first decoding and second decoding, wherein the first decoding exploits an interleaved version of the second intermediate data element that is read from the memory, wherein the first intermediate data element is stored in the memory, wherein the second decoding exploits an interleaved version of the first intermediate data element that is read from the memory, and wherein the second intermediate data element is stored in the memory; and determining part of the decoded signal from either the first or the second intermediate data elements; and assembling the determined parts of the decoded signal so as to provide the decoded signal.

4. The method of claim 2, wherein the memory is a single port memory.

5. A method of determining a decoded signal from an encoded signal, the method comprising:

receiving the encoded signal;

performing substantially simultaneously a plurality of iterative decoding methods on parts of the encoded signal, wherein each of the iterative decoding methods comprises:

iteratively performing a sequence of decoding processes, wherein each of the decoding processes exploits an interleaved version of intermediate data elements, wherein the intermediate data elements are produced by a preceding decoding process, wherein the intermediate data elements are stored in and read from a memory that is assigned to the iterative decoding methods;

determining part of the decoded signal from one of the intermediate data elements; and assembling the determined parts of the decoded signal so as to provide the decoded signal.

6. The method of claim 5, wherein the memory is a single port memory.

7. An apparatus for determining a decoded signal from an encoded signal, the apparatus being adapted for receiving the encoded signal and outpufling the decoded signal, the apparatus comprising a plurality of parallel modules, each of the modules being adapted for performing decoding, wherein each of the modules comprises:

a decoder module having at least a first input, a second input, a first output and a second output;

a memory, being assigned to the decoder module;

a feedback connection between the second output and the second input; and wherein the memory is incorporated within the feedback connection.

8. The apparatus of claim 7, wherein the memory is a single port memory.

9. The apparatus of claim 7, wherein each of the modules is adapted to perform an iterative decoding method on parts of the encoded signal.

10. The apparatus of claim 7, wherein the memory is a single memory.

11. An apparatus for determining a decoded signal from an encoded signal, the apparatus being adapted for receiving the encoded signal and outputting the decoded signal, the apparatus comprising a plurality of parallel modules, each of the modules being adapted for performing decoding, wherein each of the modules is adapted for performing an iterative decoding method on parts of the encoded signal, wherein the iterative decoding method comprises iteratively decoding an interleaved version of the intermediate data elements, wherein the intermediate data elements are produced by a preceding decoding process, wherein the data elements are stored in and read from the memory, and wherein the memory is assigned to the iterative decoding method.

12. The apparatus of claim 11, wherein the memory is a single port memory.

* * * * *